US009202900B2

(12) United States Patent
Adkisson et al.

(10) Patent No.: US 9,202,900 B2
(45) Date of Patent: Dec. 1, 2015

(54) METHOD TO BRIDGE EXTRINSIC AND INTRINSIC BASE BY SELECTIVE EPITAXY IN BICMOS TECHNOLOGY

(71) Applicant: International Business Machines Corporation, Armonk, NY (US)

(72) Inventors: James W. Adkisson, Jericho, VT (US); Kevin K. Chan, Staten Island, NY (US); David L. Harame, Essex Junction, VT (US); Qizhi Liu, Lexington, MA (US); John J. Pekarik, Underhill, VT (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 14/500,021

(22) Filed: Sep. 29, 2014

(65) Prior Publication Data

US 2015/0014747 A1   Jan. 15, 2015

Related U.S. Application Data

(62) Division of application No. 13/627,179, filed on Sep. 26, 2012, now Pat. No. 8,927,379.

(51) Int. Cl.
*H01L 29/10* (2006.01)
*H01L 29/737* (2006.01)
*H01L 29/66* (2006.01)
*H01L 29/06* (2006.01)
*H01L 29/08* (2006.01)
(Continued)

(52) U.S. Cl.
CPC ........ *H01L 29/7371* (2013.01); *H01L 29/0649* (2013.01); *H01L 29/0817* (2013.01); *H01L 29/0821* (2013.01); *H01L 29/1004* (2013.01); *H01L 29/16* (2013.01); *H01L 29/66242* (2013.01); *H01L 29/7378* (2013.01); *H01L21/82285* (2013.01); *H01L 29/66272* (2013.01); *H01L 29/732* (2013.01)

(58) Field of Classification Search
CPC ............... H01L 29/66242; H01L 29/7371; H01L 29/0649; H01L 29/0821; H01L 29/16; H01L 29/7378; H01L 29/0817; H01L 29/1004; H01L 29/66272; H01L 29/732; H01L 21/82285
USPC ......... 257/197, 198, 517, 518, 519, 586, 588, 257/E21.251, E21.166; 438/235, 309, 312, 438/204, 270, 313
See application file for complete search history.

(56) References Cited

U.S. PATENT DOCUMENTS

| | | |
|---|---|---|
| 4,997,775 A | 3/1991 | Cook et al. |
| 5,112,761 A | 5/1992 | Matthews |

(Continued)

OTHER PUBLICATIONS

Office Action Communication Dated Jun. 3, 2014, U.S. Appl. No. 13/627,179, pp. 1-7.

(Continued)

*Primary Examiner* — Thinh T Nguyen
(74) *Attorney, Agent, or Firm* — Gibb & Riley, LLC; Michael J. LeStrange, Esq.

(57) ABSTRACT

A method of forming a heterojunction bipolar transistor. The method includes providing a structure comprising at least an intrinsic base region and an emitter pedestal region. A stack is formed on the intrinsic base region. The stack comprises a polysilicon layer and a top sacrificial oxide layer. A trench is formed in the structure. The trench circumscribes the intrinsic base region and the stack. An extrinsic base is formed at two regions around the stack. The extrinsic base is formed by a selective epitaxial growth process to create a bridge over the trench. The bridge connects the two regions. An opening is provided in the stack. The opening exposes a portion of the intrinsic base region. An emitter is formed in the opening.

7 Claims, 22 Drawing Sheets

(51) Int. Cl.
*H01L 29/16* (2006.01)
*H01L 29/732* (2006.01)
*H01L 21/8228* (2006.01)

(56) References Cited

U.S. PATENT DOCUMENTS

| | | | |
|---|---|---|---|
| 5,182,225 A | 1/1993 | Matthews | |
| 6,239,477 B1 * | 5/2001 | Johnson | H01L 21/28518 257/592 |
| 6,858,485 B2 | 2/2005 | Freeman et al. | |
| 7,180,157 B2 | 2/2007 | Freeman et al. | |
| 7,618,871 B2 | 11/2009 | Meinhardt et al. | |
| 8,143,644 B2 | 3/2012 | Chung et al. | |
| 2007/0249156 A1 | 10/2007 | Bonilla et al. | |

OTHER PUBLICATIONS

Notice of Allowance Communication Dated Aug. 22, 2014, U.S. Appl. No. 13/627,179, pp. 1-15.

* cited by examiner

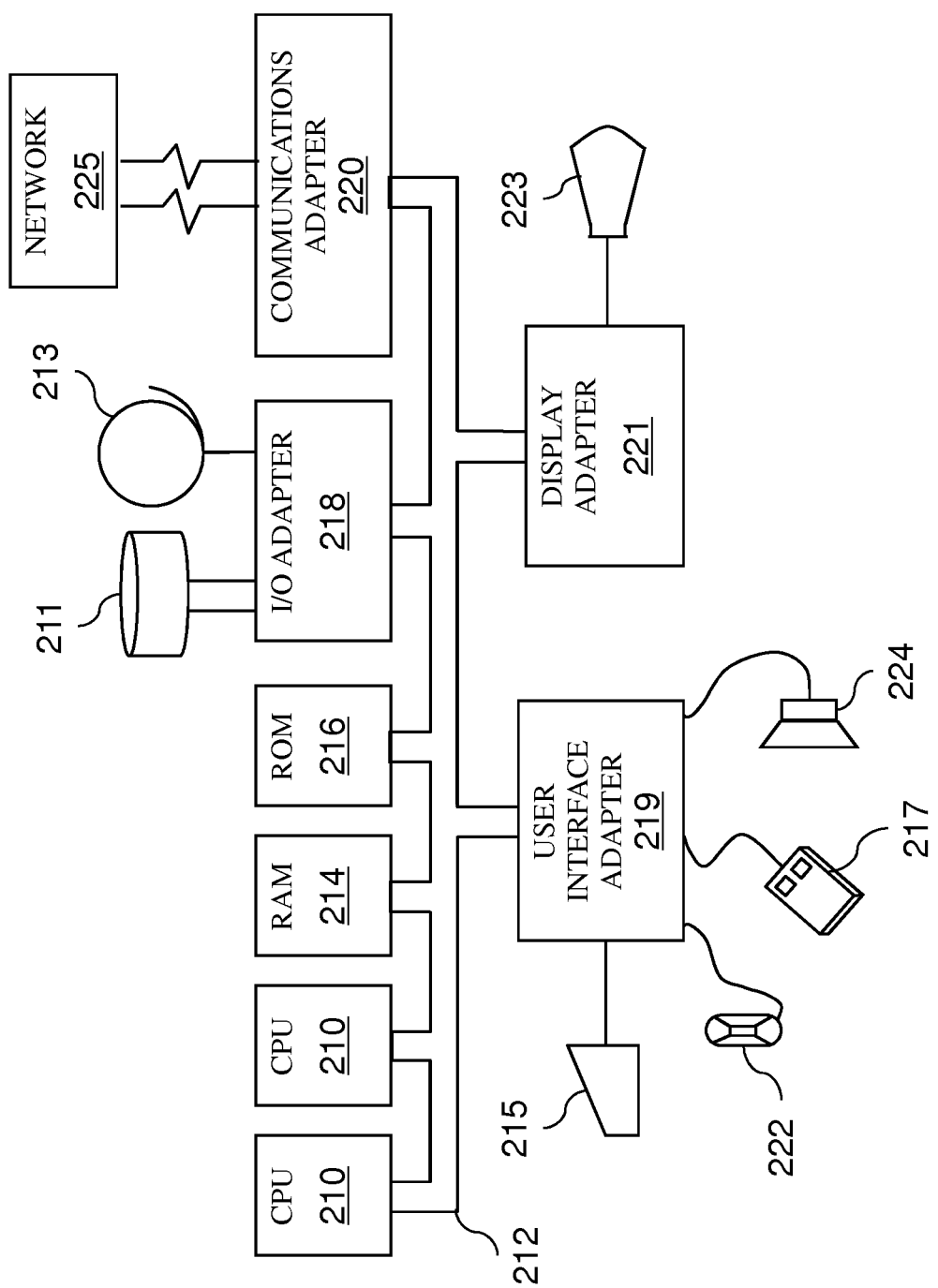

METHOD TO BRIDGE EXTRINSIC AND INTRINSIC BASE BY SELECTIVE EPITAXY IN BICMOS TECHNOLOGY

CROSS-REFERENCE TO RELATED APPLICATIONS

This application is a divisional of U.S. patent application Ser. No. 13/627,179, filed Sep. 26, 2012, issued as U.S. Pat. No. 8,927,379 on Jan. 6, 2015, the complete disclosure of which is incorporated herein by reference.

BACKGROUND

The present disclosure relates to semiconductor structures, and more particularly to bipolar complementary metal-oxide-semiconductor (BiCMOS) integrated structures including a bipolar transistor having a self-aligned emitter, base, and collector, the base formed by selective epitaxy to bridge base regions.

In recent years, much effort has been directed toward perfecting a method of integrating bipolar and complementary metal oxide semiconductor (CMOS) technologies on a single wafer. The ability to combine CMOS with bipolar processes in a single ("BiCMOS") process is extremely desirable for high performance circuits. For example, CMOS transistors are inherently low power devices with large noise margins that can achieve a high packing density. Meanwhile, bipolar transistors provide advantages in switching speed and current drive. Bipolar transistors are also characterized by high transconductance that is well suited for driving capacitive loads.

Besides the positive effect of enhancing the switching speed of the device, there are problems in that the changes in the collector of the bipolar transistor have some potentially negative side effects. One such problem is the increase of avalanche multiplication from the increased electric field in the collector-base space-charge region. A second problem is the increase of self-heating of the device. Such effects are described in more detail in G. Freeman, J.-S. Rieh, B. Jagannathan, Z. Yang, F. Guarin, A. Joseph, D. Ahigren, "SiGe HBT Performance and Reliability Trends through f.sub.T of 350 GHz," Proc. IEEE Reliability Physics Symposium (Mar. 30, 2003) (hereinafter referred to as Freeman 2003) and M. Rickelt, H. M. Rein and, E. Rose, "Influence of Impact-Ionization Induced Instabilities on the Maximum Usable Output Voltage of Si-Bipolar Transistors," IEEE Trans. on Electron Devices Vol. 48 n. 4 p. 774-783 (April 2001) (hereinafter referred to as Rickelt 2001). One solution to the problem of the increasing self-heating of the device is to spread the current and thus the power over a larger region of the device, which reduces the thermal resistance and reduces the temperature rise of the device. Typically, as the current density of the device is increased due to the increased collector concentration, the width of the lithographically-defined emitter is reduced inversely with the current density increase, resulting in a similar current per unit length of the device.

One of the difficulties presented in integrating an MOS device with a bipolar device in the same circuit is that the fabrication steps required to form each of the separate devices often differ radically. That is, the steps used to fabricate a bipolar device are vastly different from the steps required to fabricate a CMOS or an MOS device.

SUMMARY

According to an embodiment herein, a method of forming a heterojunction bipolar transistor is disclosed. The method includes providing a structure comprising at least an intrinsic base region and an emitter pedestal region. A stack is formed on the intrinsic base region. The stack comprises a polysilicon layer and a top sacrificial oxide layer. A trench is formed in the structure. The trench circumscribes the intrinsic base region and the stack. An extrinsic base is formed at two regions around the stack. The extrinsic base is formed by a selective epitaxial growth process to create a bridge over the trench. The bridge connects the two regions. An opening is provided in the stack. The opening exposes a portion of the intrinsic base region. An emitter is formed in the opening.

According to another embodiment herein, a method of forming a semiconductor device is disclosed. The method includes providing a self-aligned sacrificial emitter process pedestal stack on a wafer. A SiGe layer is grown on the wafer. A trench is formed in the wafer. The trench circumscribes the pedestal stack and defines an intrinsic base of a bipolar transistor. A selective epitaxial growth process is performed to form an extrinsic base at two regions around the stack and a bridge over the trench. The bridge connects the two regions. The selective epitaxial growth process ensures substantially no growth originates from a bottom of the trench. An emitter window is formed in the pedestal stack. In-situ doped emitter deposition is performed in the emitter window. Photolithographic deposition and etching is performed to define an emitter of the bipolar transistor.

According to another embodiment herein, a semiconductor device is disclosed. The semiconductor device includes a bipolar transistor comprises a collector in an active region of a multi-layer substrate, an emitter, and an intrinsic base arranged between the emitter and the collector. A trench circumscribes the emitter and the intrinsic base. An extrinsic base forms a bridge over the trench.

According to another example, a non-transitory computer readable storage medium readable by a computerized device is disclosed. The non-transitory computer readable storage medium stores instructions executable by the computerized device to perform a method of forming a heterojunction bipolar transistor in a structure comprising at least an intrinsic base region and an emitter pedestal region. According to the method, a stack is formed on the intrinsic base region. The stack comprises a polysilicon layer and a top sacrificial oxide layer. A trench is formed in the structure. The trench circumscribes the intrinsic base region and the stack. An extrinsic base is formed at two regions around the stack. The extrinsic base is formed by a selective epitaxial growth process to create a bridge over the trench. The bridge connects the two regions. An opening is provided in the stack. The opening exposes a portion of the intrinsic base region. An emitter is formed in the opening.

BRIEF DESCRIPTION OF THE DRAWINGS

The foregoing and other exemplary purposes, aspects and advantages will be better understood from the following detailed description of an exemplary embodiment herein with reference to the drawings, in which:

FIG. 22 is a schematic diagram of a hardware system according to embodiments herein.

DETAILED DESCRIPTION

Figure 1:
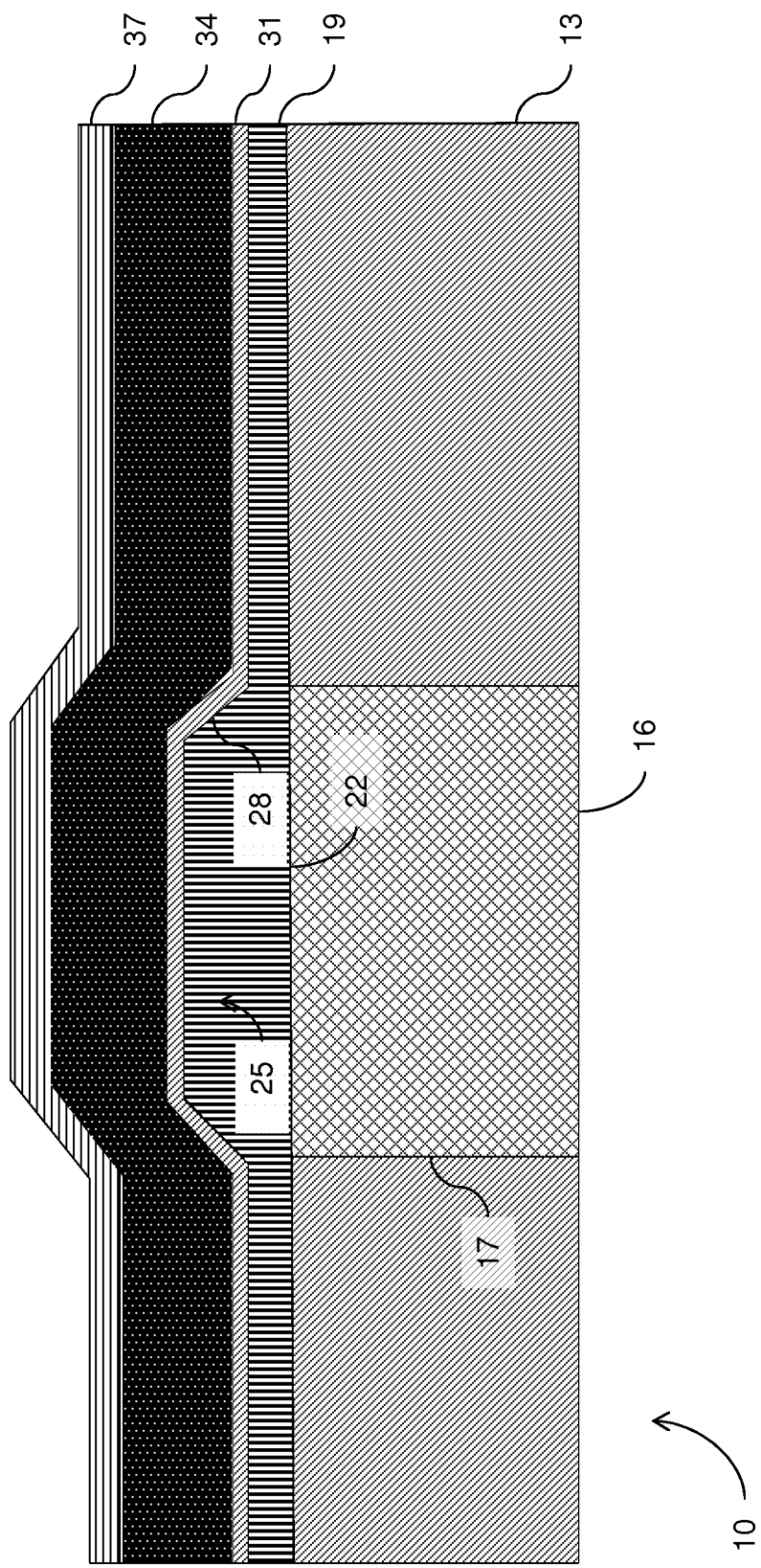
FIGS. 1-20 are schematic diagrams of a sectional view of semiconductor structure in fabricating an SASE (self-aligned sacrificial emitter) bridge structure according to embodiments herein.

A transistor is either a bipolar transistor or a field effect transistor (FET). Bipolar junction transistors may be combined with complementary metal-oxide-semiconductor (CMOS) field effect transistors in bipolar complementary metal-oxide-semiconductor (BiCMOS) integrated circuits, which take advantage of the favorable characteristics of both transistor types. The technology described herein is BiC-MOS, which means that two types of transistors, both FETs and bipolar transistors are built on the same wafer. Conventional bipolar junction transistors include three semiconductor regions, namely the emitter, base, and collector regions. Generally, a bipolar junction transistor includes a pair of p-n junctions, namely an emitter-base junction and a collector-base junction. A heterojunction bipolar transistor (HBT) is a variety of bipolar junction transistor that employs at least two semiconductor materials with unequal band gaps for the emitter and base regions, creating a heterojunction. For example, the base of an HBT may be comprised of silicon germanium (SiGe), which is characterized by a narrower band gap than silicon typically composing the emitter of the HBT.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can comprise any material appropriate for the given purpose (whether now known or developed in the future) and can comprise, for example, Si, SiC, SiGe, SiGeC, other III-V or II-VI compound semiconductors, or organic semiconductor structures, etc. The "shallow trench isolation" (STI) structures are well known to those ordinarily skilled in the art and are generally formed by patterning openings/trenches within the substrate and growing or filling the openings with a highly insulating material (this allows different active areas of the substrate to be electrically isolated from one another).

Referring now to the drawings, there are shown exemplary illustrations of the method and structures of a BiCMOS transistor in a semiconductor wafer.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

FIG. 1 illustrates a schematic diagram of a cross-sectional view of a multi-layer substrate 10 for fabricating an SASE (self-aligned sacrificial emitter) bridge structure. Substrate 10 may be any suitable bulk substrate containing a multiple layers of semiconductor material that a person having ordinary skill in the art would recognize as suitable for forming an integrated circuit. For example, substrate 10 may be comprised of layers having monocrystalline silicon-containing material, such as single crystal silicon with a crystal lattice orientation. The monocrystalline semiconductor material may contain a definite defect concentration and still be considered single crystal. The semiconductor material of the various layers constituting substrate 10 may be lightly doped with an impurity to alter their electrical properties. Specifically, some layers may be lightly doped with a p-type impurity species, such as boron, to render it p-type in which holes are the majority carriers and dominate the electrical conductivity of the constituent semiconductor material. Some layers may be lightly doped with an n-type impurity species, such as arsenic to render it n-type in which electrons are the majority carriers and dominate the electrical conductivity of the semiconductor material.

The substrate 10 includes a bottom layer 13. The collector 16 of an NPN-type HBT, described herein, is located in the bottom layer 13. Bottom layer 13 may be comprised of an appropriate material, such as silicon dioxide (SiO2). As described below, the region employs shallow trench isolation (STI) techniques, a feature that prevents electrical current leakage between adjacent semiconductor device components. The STI process provides a boundary 17 between the collector 16 and the remainder of the bottom layer 13.

A layer 19, which is comprised of a material suitable for forming an intrinsic base of the heterojunction bipolar transistor described herein, is deposited on the top surface of bottom layer 13 and, in particular on the active region of the substrate 10. Layer 19 may be formed using a low temperature epitaxial (LTE) growth process (typically at a growth temperature ranging from 400° C. to 850° C.). Layer 19 may contain a semiconductor material comprised of silicon (Si) and germanium (Ge) in a $S_xG_{1-x}$ alloy having a germanium content in a range between about 5 atomic percent and about 50 atomic percent. The germanium content of the layer 19 may be uniform or the germanium content of layer 19 may be graded or stepped across the thickness of layer 19. As described below, the intrinsic base 22 of the transistor is in layer 19.

Layer 19 includes a raised region 25 laterally positioned in vertical alignment with the collector 16 in an active region of the substrate 10. The intrinsic base 22 should be a single crystal containing SiGe layer. LTE growth of layer 19 would render a single crystal region for the intrinsic base 22 over the single crystalline substrate region of the collector 16, which is flat in the raised region 25. Layer 19 includes a faceted region 28, near the STI boundary 17. The poly over STI region is generally thinner than the single crystal region of the intrinsic base 22. The thickness of the layer 19 may range from about 10 nm to about 600 nm with the largest layer thickness in the raised region 25.

A layer 31, which contains a material with a different composition than layer 19, is deposited on a top surface of layer 19. Layer 31 may be comprised of a dielectric, which is an insulating material having a lesser degree of electrical conduction and a higher dielectric constant than layer 19. In one embodiment, layer 31 may be a high temperature oxide (HTO) deposited using an appropriate method, such as rapid thermal chemical vapor deposition (RTCVD) at temperatures of 500° C. or higher, and may be comprised of an oxidized silicon, such as silicon dioxide (SiO2). Alternatively, layer 31 may be deposited or grown by another suitable process. The physical layer thickness of layer 31 may be approximately from 5 to 30 nm.

A layer 34, which contains a material with a different composition than layer 31, is deposited on a top surface of layer 31. In one embodiment, layer 34 may be comprised of a polycrystalline silicon deposited using any suitable process. The physical layer thickness of layer 34 may be approximately from 500 to 3500 Å.

Another layer, sacrificial layer 37, which contains a material with a different composition than layer 34, is deposited on a top surface of layer 34. In one embodiment, the sacrificial layer 37 may comprise an oxide layer. The physical layer thickness of sacrificial layer 37 may be approximately 200 Å. In some embodiments, there may be a thin Silicon nitride (Si$_3$N$_4$) layer, approximately 200 Å thick, (not shown) between layer 34 and the sacrificial layer 37.

For purposes herein, an "insulator" is a relative term that means a material or structure that allows no (many orders of magnitude difference) electrical current to flow than does a "conductor." The dielectrics (insulators) mentioned herein can, for example, be formed by plasma deposition of SiO2 or SiO2 based materials by reacting either tetra-ethyl-orthosilane (TEOS) or silane with O2 or activated O2, i.e. O3 or O—. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, nickel, aluminum, or copper, or a metal silicide, any alloys of such metals, and may be deposited using physical vapor deposition, chemical vapor deposition, or any other technique known in the art.

Figure 2:
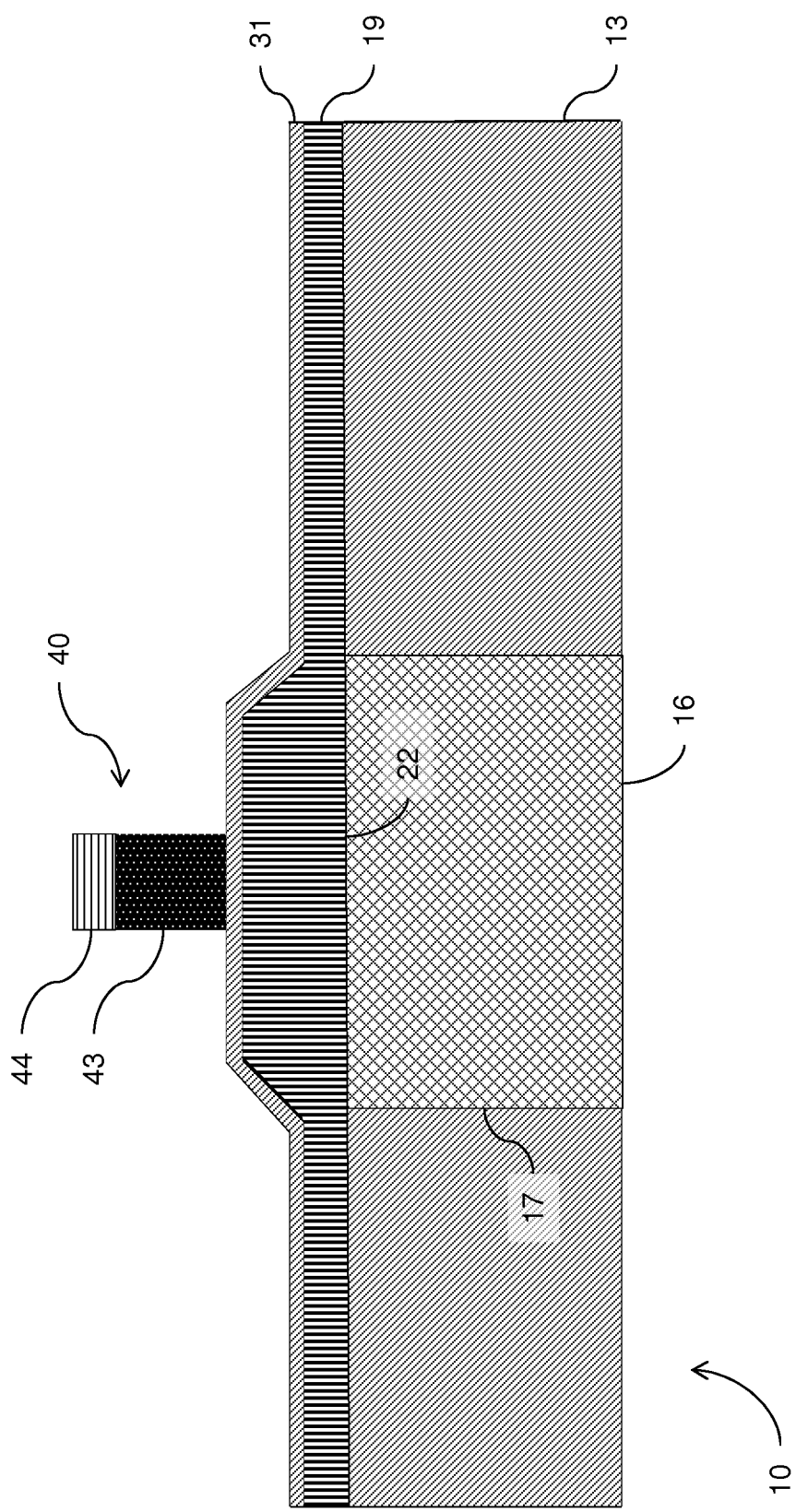

As shown in FIG. 2, a sacrificial emitter stack 40 is formed on the substrate 10. A portion of layer 34 and sacrificial layer 37 are removed. The sacrificial emitter stack 40 includes a polysilicon portion 43 and an oxide portion 44. The sacrificial emitter stack 40 can be formed by any appropriate means, such as by photolithography to apply a pattern and etching the various layer materials, for example using conventional etching processes that customarily form polysilicon conductors in integrated circuit structures.

The sacrificial emitter stack 40, comprising the polysilicon portion 43 and the oxide portion 44, may be patterned using photolithography and subtractive etching processes to define the sacrificial emitter stack, generally indicated by reference numeral 40. To that end, the sacrificial emitter stack 40 comprising the polysilicon portion 43 and the oxide portion 44 is masked with a patterned mask layer (not shown). In one embodiment, the mask layer may be a photoresist layer comprised of a sacrificial organic material applied to the top surface of the sacrificial layer 37 by spin coating. The photolithography process entails exposing the photoresist layer to radiation imaged through a photomask and developing the resultant latent feature pattern in the exposed resist to define residual areas of photoresist that mask portions of the sacrificial layer 37. A subtractive etching process, such as a reactive-ion etching (RIE) process or a wet chemical etching process, can be used to remove regions of layer 34 and sacrificial layer 37 not protected by the mask layer. At the conclusion of the subtractive etching process, the top surface of layer 31 is exposed aside from the portion covered by the sacrificial emitter stack 40.

Figure 3:
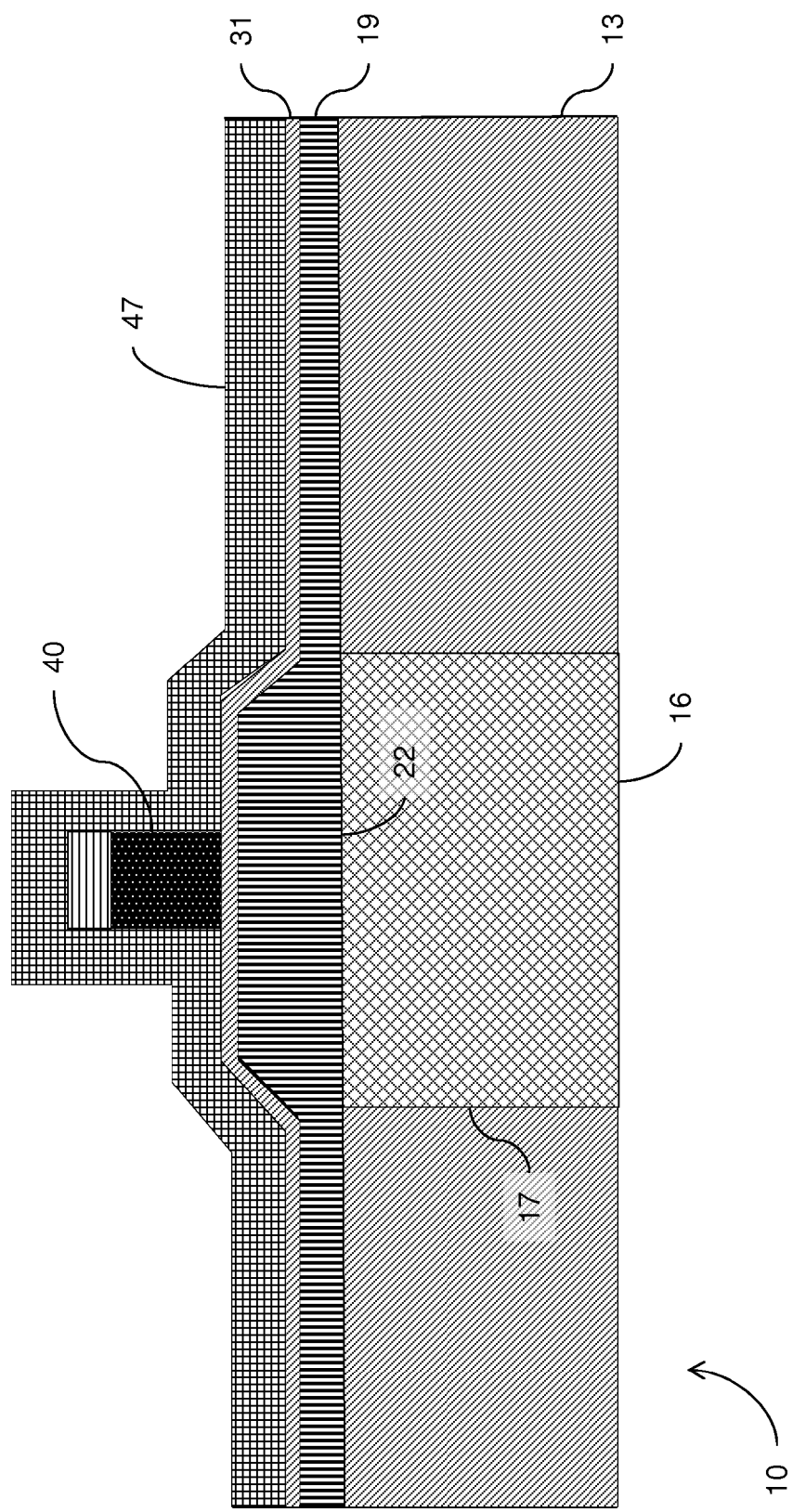

In FIG. 3, a nitride blanket 47 is deposited over the sacrificial emitter stack 40 and exposed portions of layer 31 in order to prepare for selective epitaxial growth of an extrinsic base, as described in more detail below.

Figure 4:
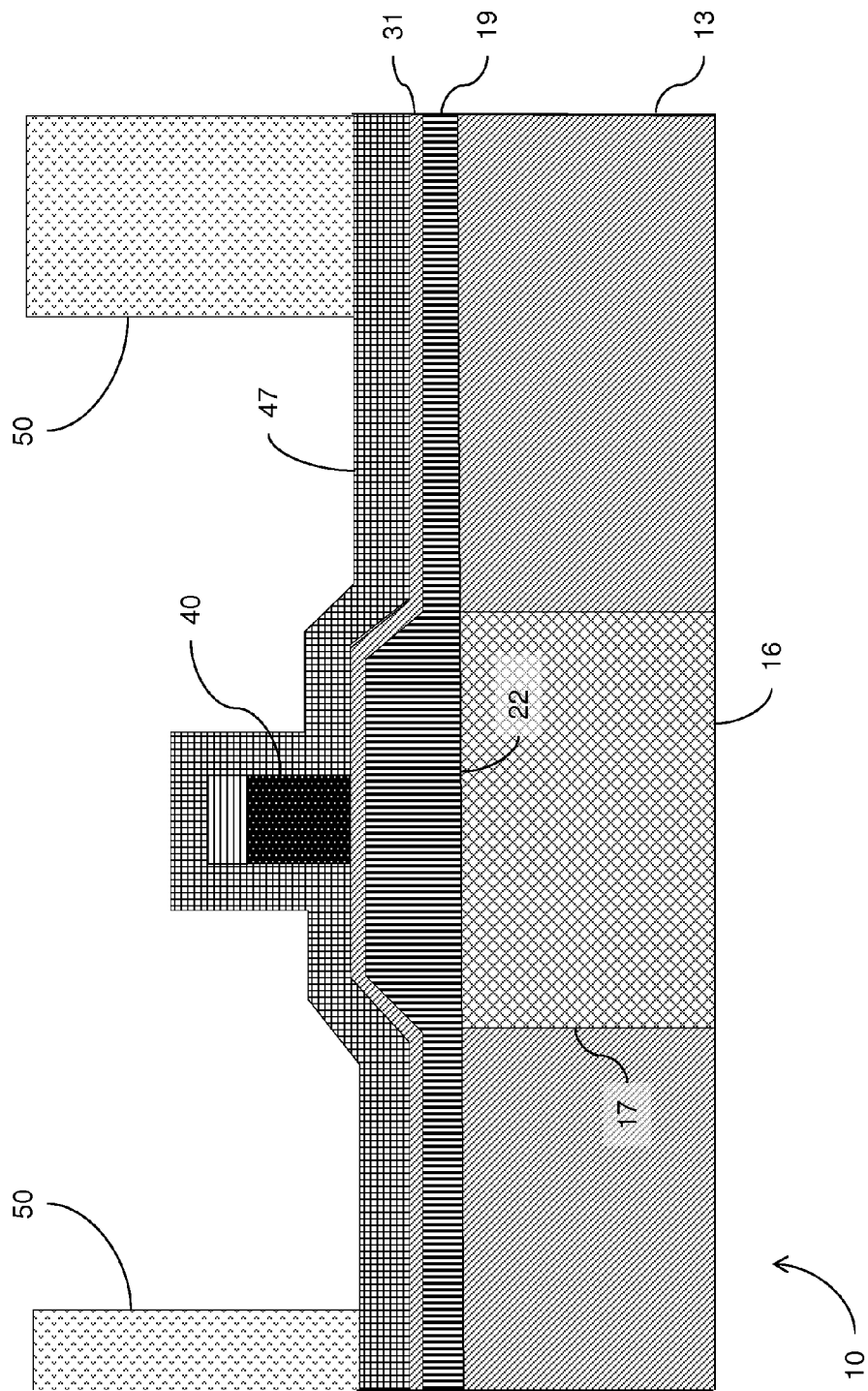

FIG. 4 illustrates a portion of a mask 50 patterned and applied to the top surface of the nitride blanket 47. The mask 50 protects portions of the substrate 10 while using a material removal process.

A hardmask can be formed of any suitable material, whether now known or developed in the future, such as a metal or organic or inorganic (Si3N4, SiC, SiO2C (diamond)) hardmask, that has etch resistance greater than the substrate and insulator materials used in the remainder of the structure.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

Figure 5:
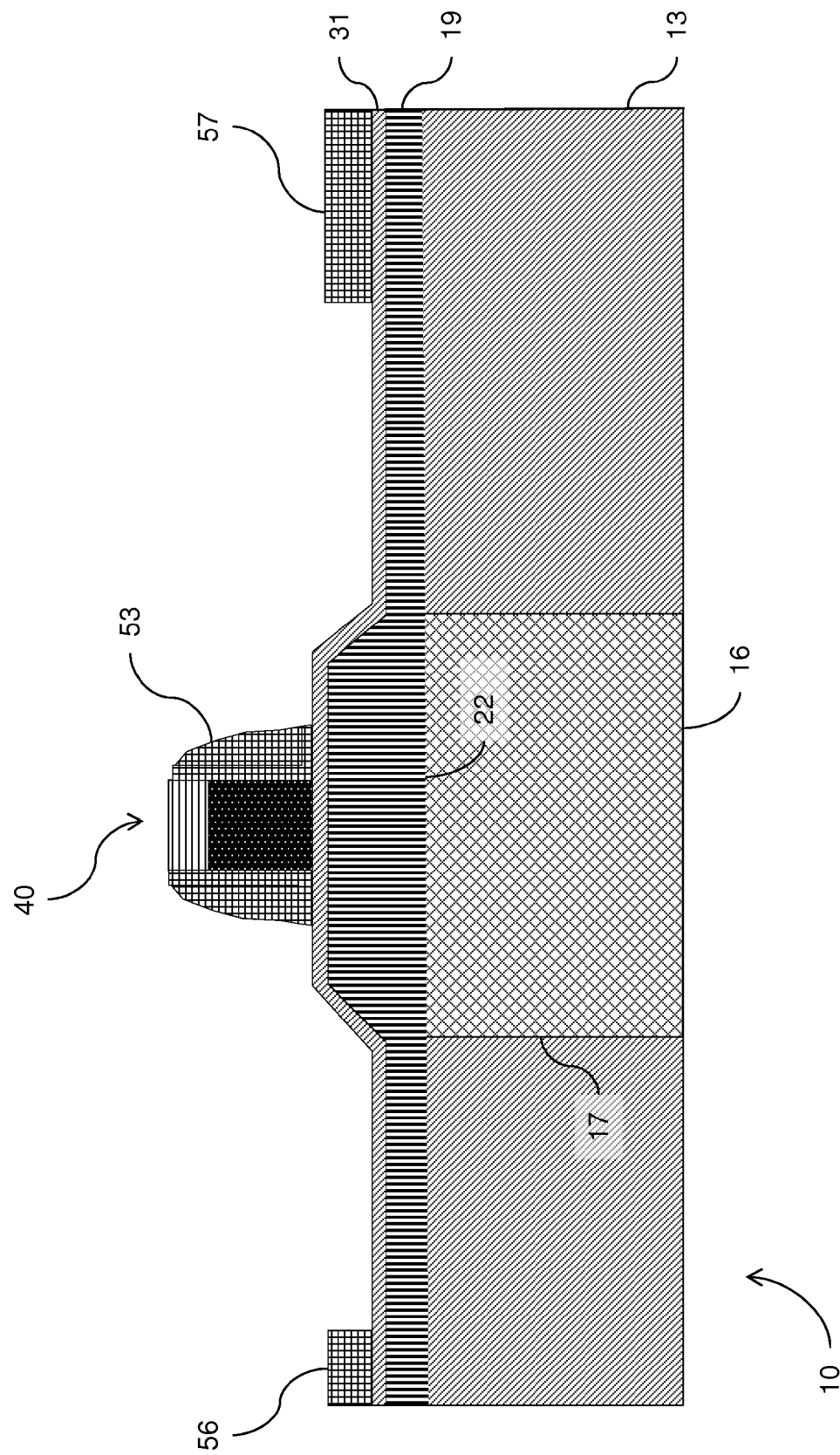

FIG. 5 shows a schematic diagram illustrating another sectional view of fabricating an SASE bridge structure in which the mask 50 of FIG. 4 has been removed and a nitride spacer 53 has been formed around the sacrificial emitter stack 40. Nitride pads 56, 57 are created over a portion of layer 31. The nitride pads 56, 57 remain outside of the NPN base region.

Figure 6:
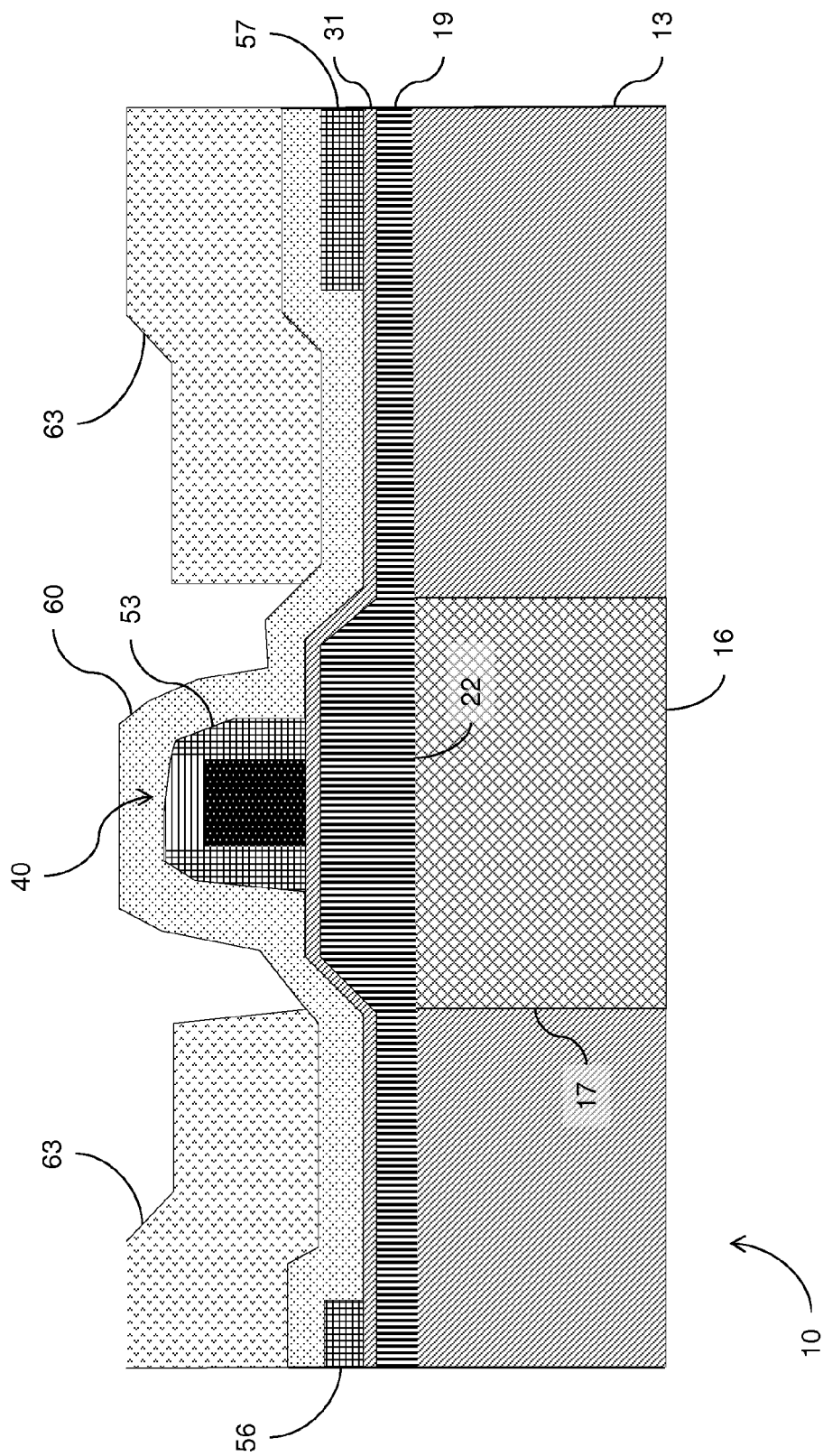
Figure 7:
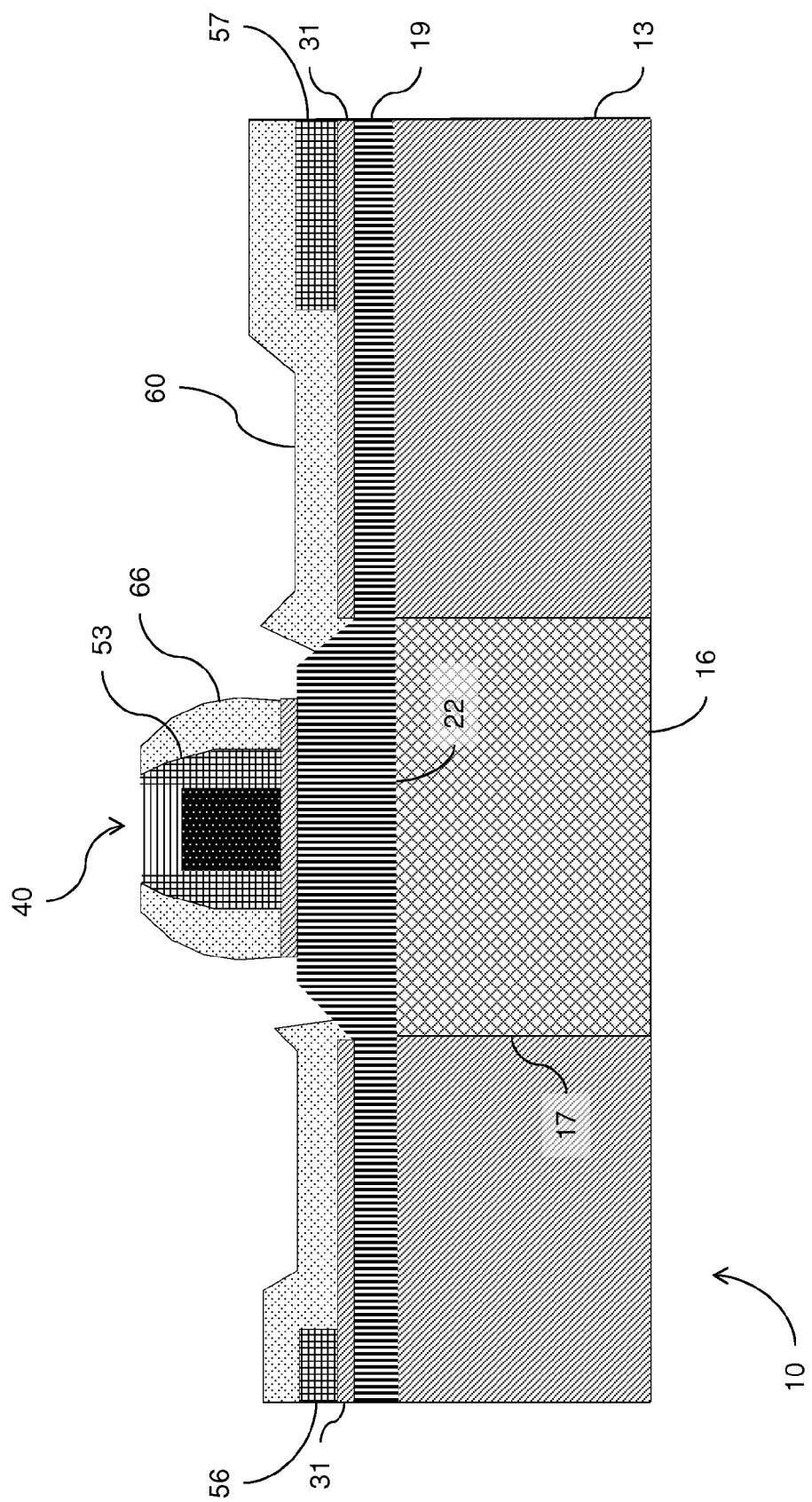

In FIG. 6, an oxide blanket 60 is deposited over the sacrificial emitter stack 40, nitride spacer 53, and exposed portions of layer 31 and nitride pads 56, 57. The oxide blanket 60 may be applied using a plasma enhanced chemical vapor deposition (PECVD) process with highest hydrofluoric acid (HF) removal rate. As is known in the art, different oxide types etch differently. PECVD oxide usually etches faster in HF than other oxides, such as thermal oxides. In some embodiments, a second (optional) mask 63 is patterned and applied to the top surface of the oxide blanket 60. The oxide blanket 60 is then etched according to the second mask 63, forming an oxide spacer 66 adjacent to the nitride spacer 53 around the sacrificial emitter stack 40, as shown in FIG. 7.

Figure 8:
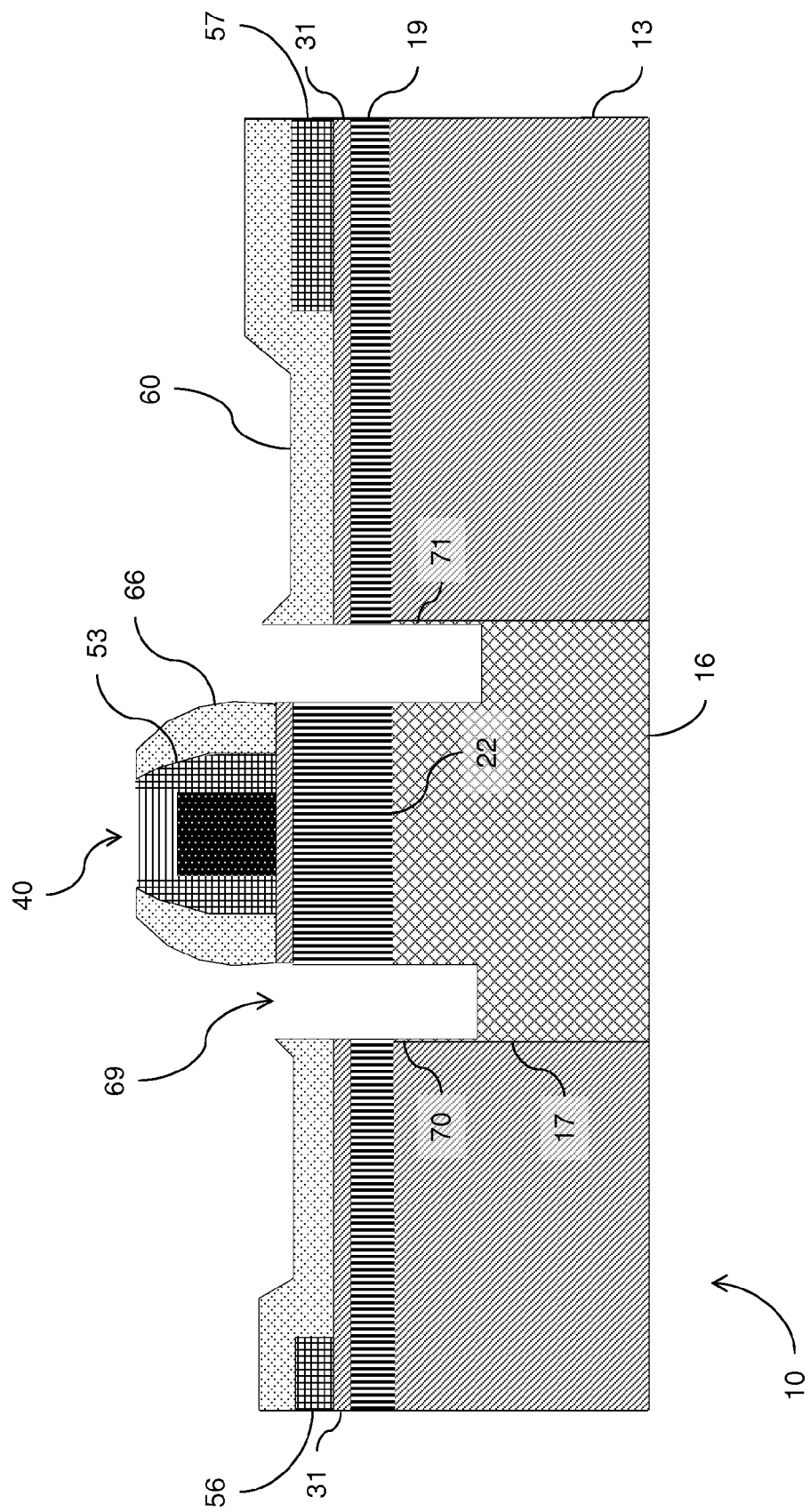

In FIG. 8, a narrow trench 69 has been formed around the sacrificial emitter stack 40. In some embodiments, the trench 69 can be formed by timed Si etching. The HBT described herein is of a type known as self-aligned, sacrificial emitter. The trench 69 circumscribes sacrificial emitter stack 40. Typically, when trench 69 is formed, there is a thin "slice" of silicon 70, 71 of the collector 16 between the STI boundary 17 and the trench 69. This trench 69 would electrically isolate the HBT collector 16 directly underneath the intrinsic base 22 from this slice of silicon 70, 71.

The trench 69 is in addition to the regular STI region that is formed during the regular part of the CMOS process, which is formed by a lithography and dry etching process to define a closed-bottomed trench around the sacrificial emitter stack 40.

In some embodiments, a thin layer of silicon (not shown) may be deposited on the sidewalls of the trench 69. If deposited, the thin layer of silicon is preferably p-doped. If the optional silicon layer were deposited, it would all be converted to silicon dioxide by the high-pressure oxidation (HIPOX) step described below.

Figure 9:
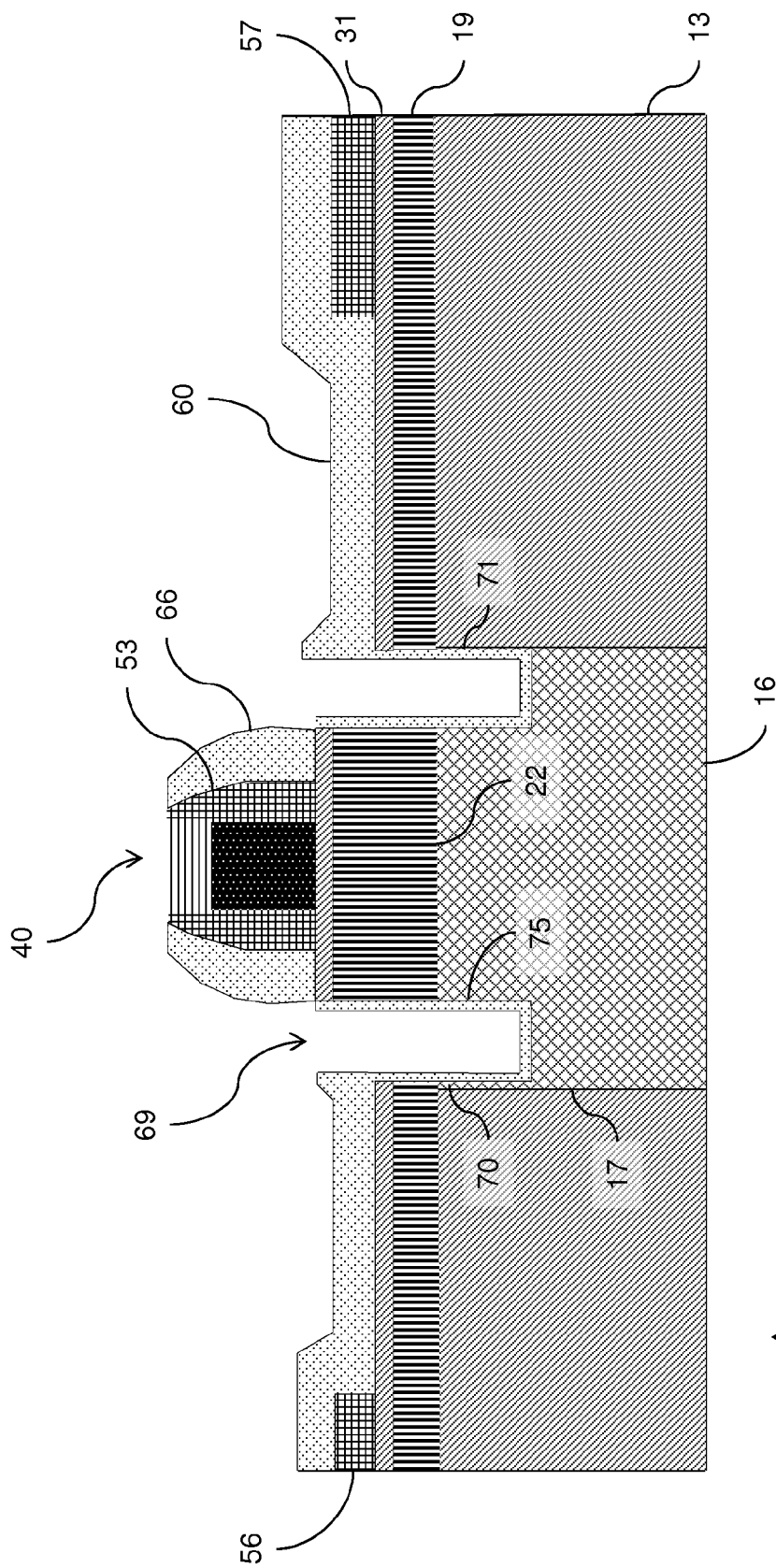

After the trench 69 has been formed, a thin oxide layer 75, for example, approximately 5 nm thick, may be applied to passivate the trench 69, as shown in FIG. 9. In some embodiments, the thin oxide layer 75 may be formed using high-pressure oxidation (HIPOX).

Figure 10:
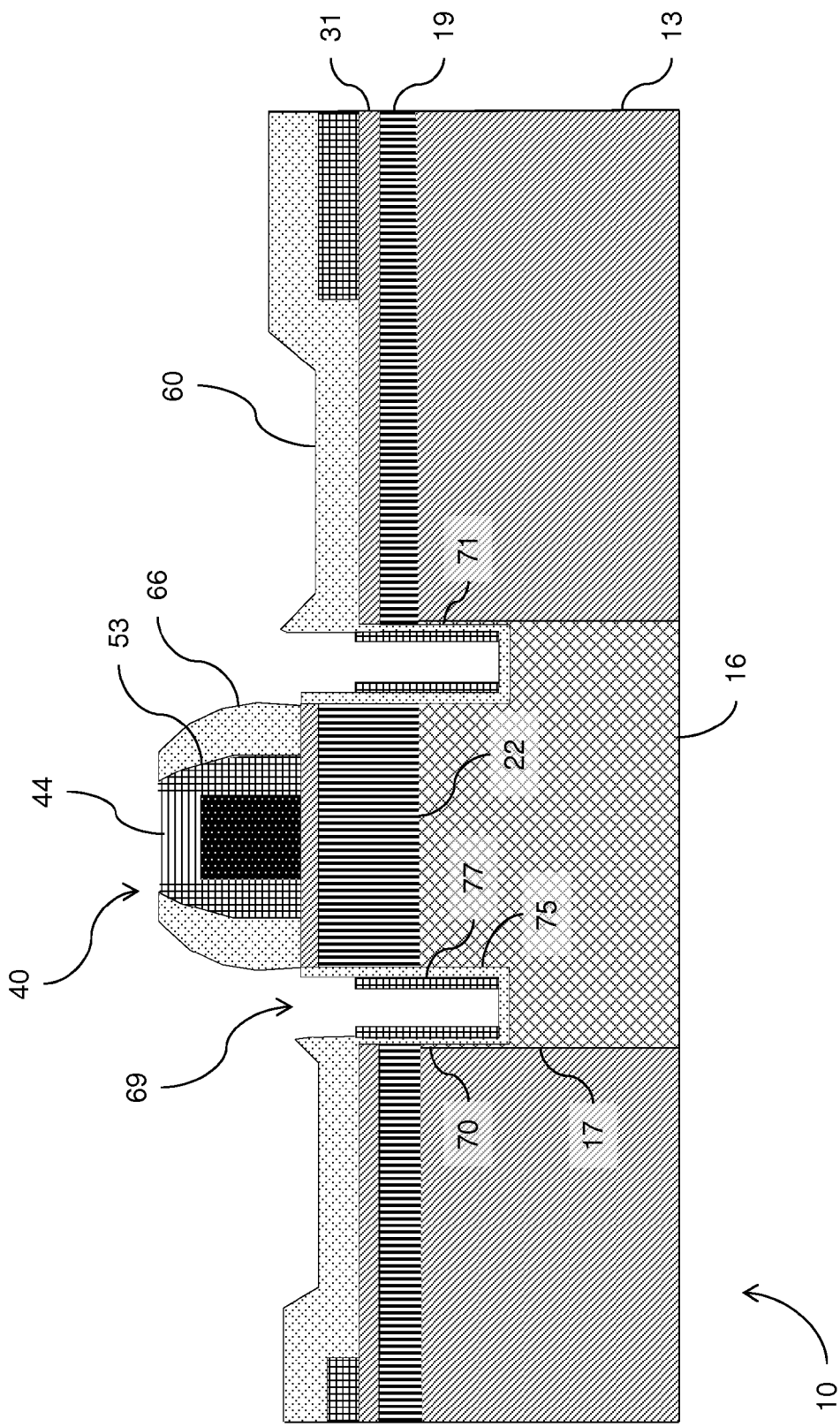

In FIG. 10, nitride has been deposited and etched to form a nitride spacer 77 inside the trench 69. The nitride etch used to pattern the nitride spacer 77 will have enough overetching characteristics to leave no nitride film over the oxide spacer 66 on the side of the sacrificial emitter stack 40.

For purposes herein, "sidewall spacers" are structures that are well-known to those ordinarily skilled in the art and are generally formed by depositing or growing a conformal insulating layer (such as any of the insulators mentioned above) and then performing a directional etching process (anisotropic) that etches material from horizontal surfaces, thereby leaving insulating material along the vertical sidewalls of structures since the etch is vertically directional and the effective thickness vertically is much thicker. This material left on the vertical sidewalls is referred to as sidewall spacers.

Figure 11:
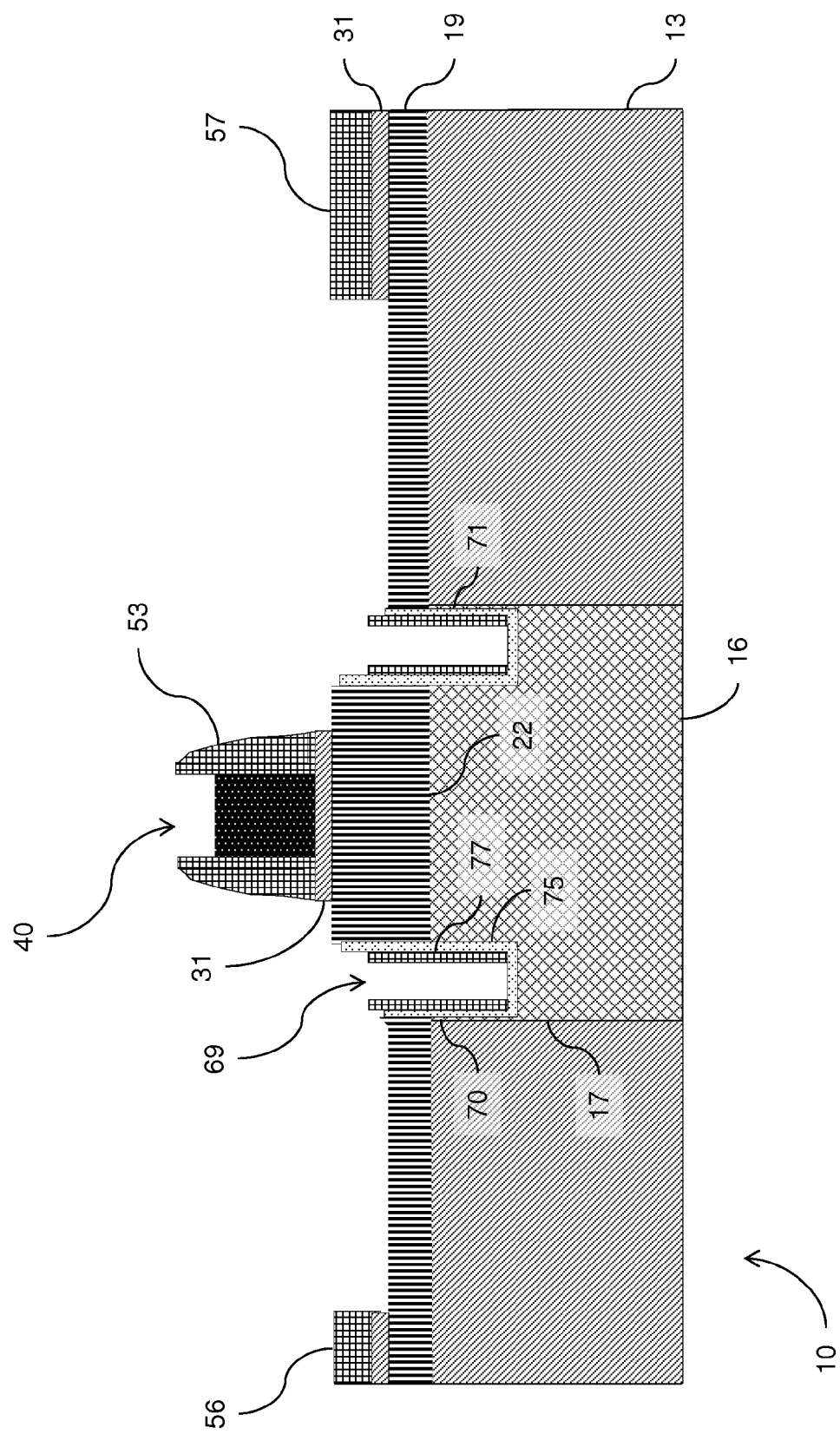

In FIG. 11, the oxide blanket 60, oxide spacer 66, and the oxide portion 44 of the sacrificial emitter stack 40 have been removed. In some embodiments, the oxide portion 44, oxide blankets 60, and oxide spacer 66 are removed by wet chemical etching, as would be known in the art. Note a segment of layer 31 remains below the sacrificial emitter stack 40, above the intrinsic base 22.

Figure 12:
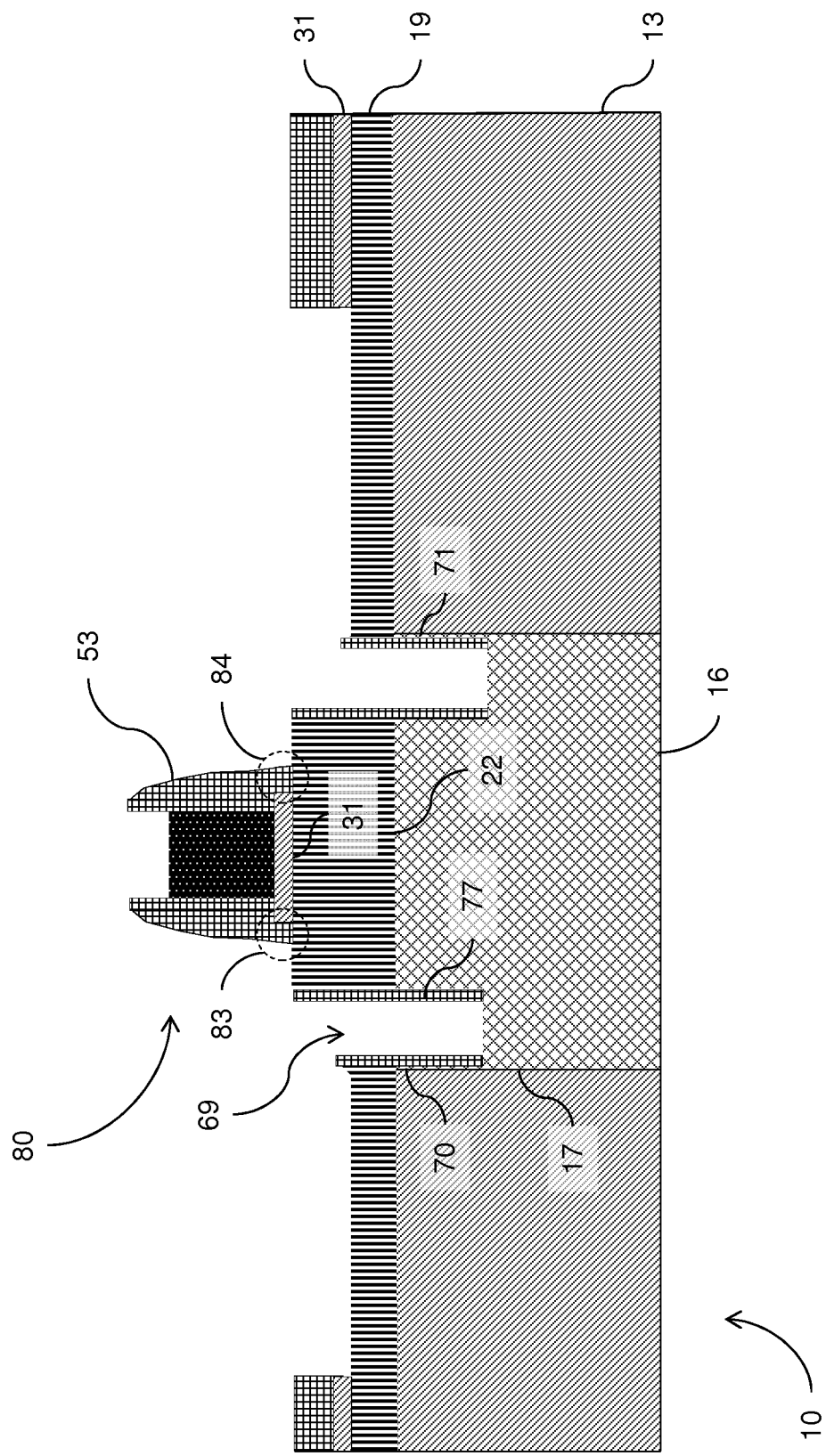

As shown in FIG. 12, a nitride blanket can be optionally deposited and etched to add thickness to the nitride spacer 77 inside the trench 69 and around the emitter pedestal 80, as indicated at 83, 84. According to embodiments herein, endpoint etching, as is known in the art, can be to determine when all nitride film is etched. For clarity, the oxide passivation layer inside trench 69 is not shown in FIG. 12 and the remaining cross-sectional drawings.

Figure 13:
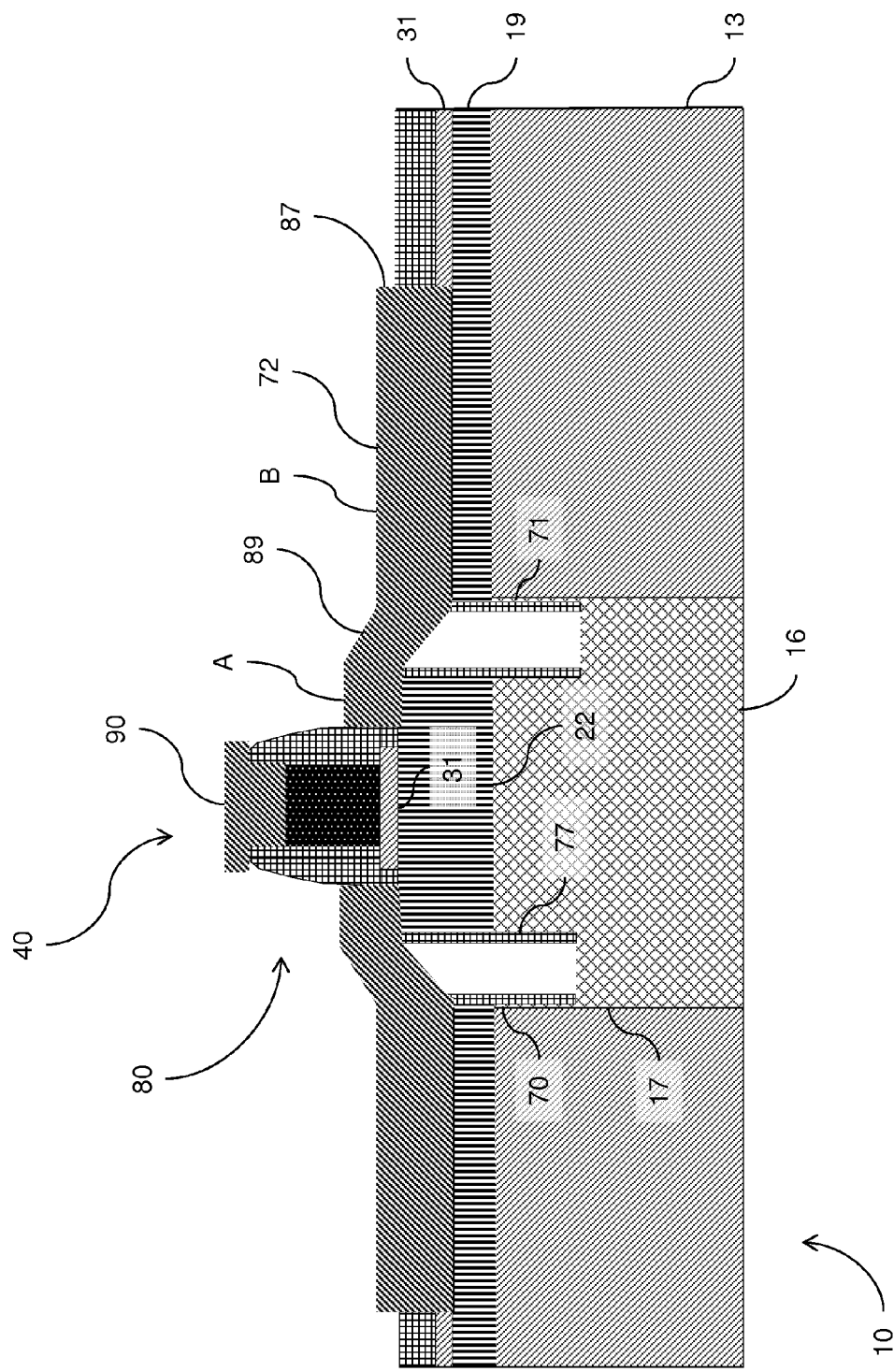

Referring to FIG. 13, selective epitaxy is used to apply a Si and/or SiGe layer 87 around the emitter pedestal 80. Epitaxial growth of the Si/SiGe layer 87 forms an extrinsic base 72 in two regions, labeled A and B, and forms a bridge 89 over the trench 69 in order to connect the two regions of the extrinsic base 72 with each other.

This is a critical and challenging step. It is important to employ growth conditions so that little growth originates from the bottom of the trench 69. Additionally, sideways growth of the emitter pedestal 80 can be minimized by making the height of the nitride spacer 53 on the sacrificial emitter stack 40 taller than the polysilicon portion 43 of the emitter pedestal 80. Additionally, as shown in FIG. 13, a Si/SiGe cap 90 is formed via selective epitaxy in the sacrificial emitter stack 40 as part of the epitaxial growth process. In general, for the emitter pedestal 80, it is desirable to restrict the lateral growth of the Si/SiGe cap 90. Having a deep oxide portion 44 in the sacrificial emitter stack 40 in comparison to the nitride spacer 53 results in less lateral growth of the Si/SiGe cap 90.

Epitaxial growth according to embodiments herein is performed via selective epitaxy. Selective epitaxial growth (SEG) of the Si/SiGe layer 87 may occur by mixing gases including: a gas containing a p-type impurity, such as diborane ($B_2H_6$) or another boron (B)-containing gas; a silicon (Si)-containing gas, for example, one of silane ($SiH_4$) and disilane ($Si_2H_6$); and a germanium (Ge)-containing gas, for example, one of germane ($GeH_4$) and digermane ($Ge_2H_6$). The SEG process is usually performed at a sub-atmospheric process pressure (e.g., 40 torr) and typically with a substrate temperature between about 400° C. and about 750° C. The growth temperature may be at the lower end of the range if the film is grown with more Ge content. The film is only grown over exposed single-crystal Si or poly Si surfaces, but not on dielectric films such as oxide or nitride. The Si/SiGe layer 87 mainly forms an extrinsic base 72, which may be electrically connected to the intrinsic base 22.

Figure 14:
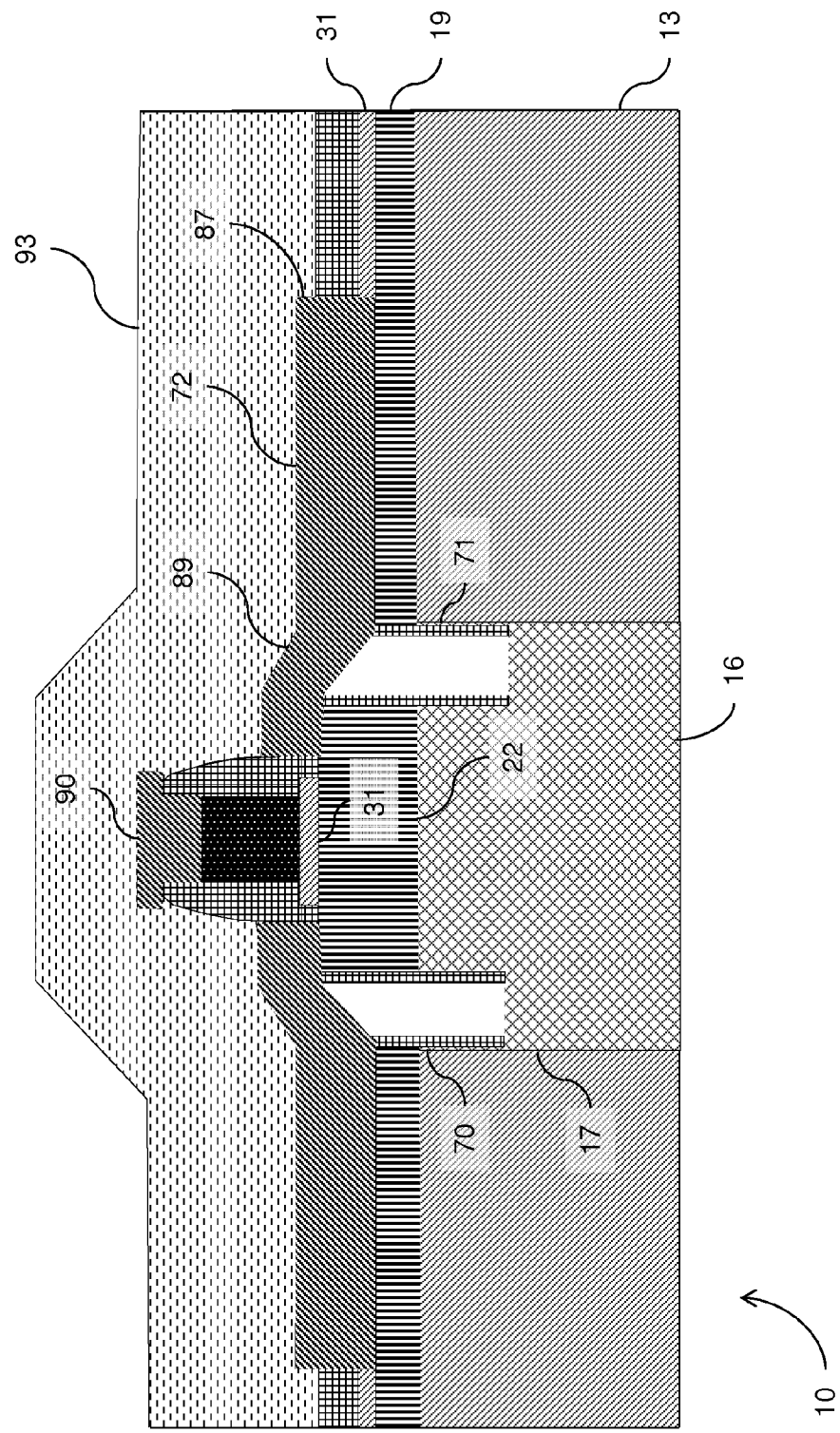
Figure 15:
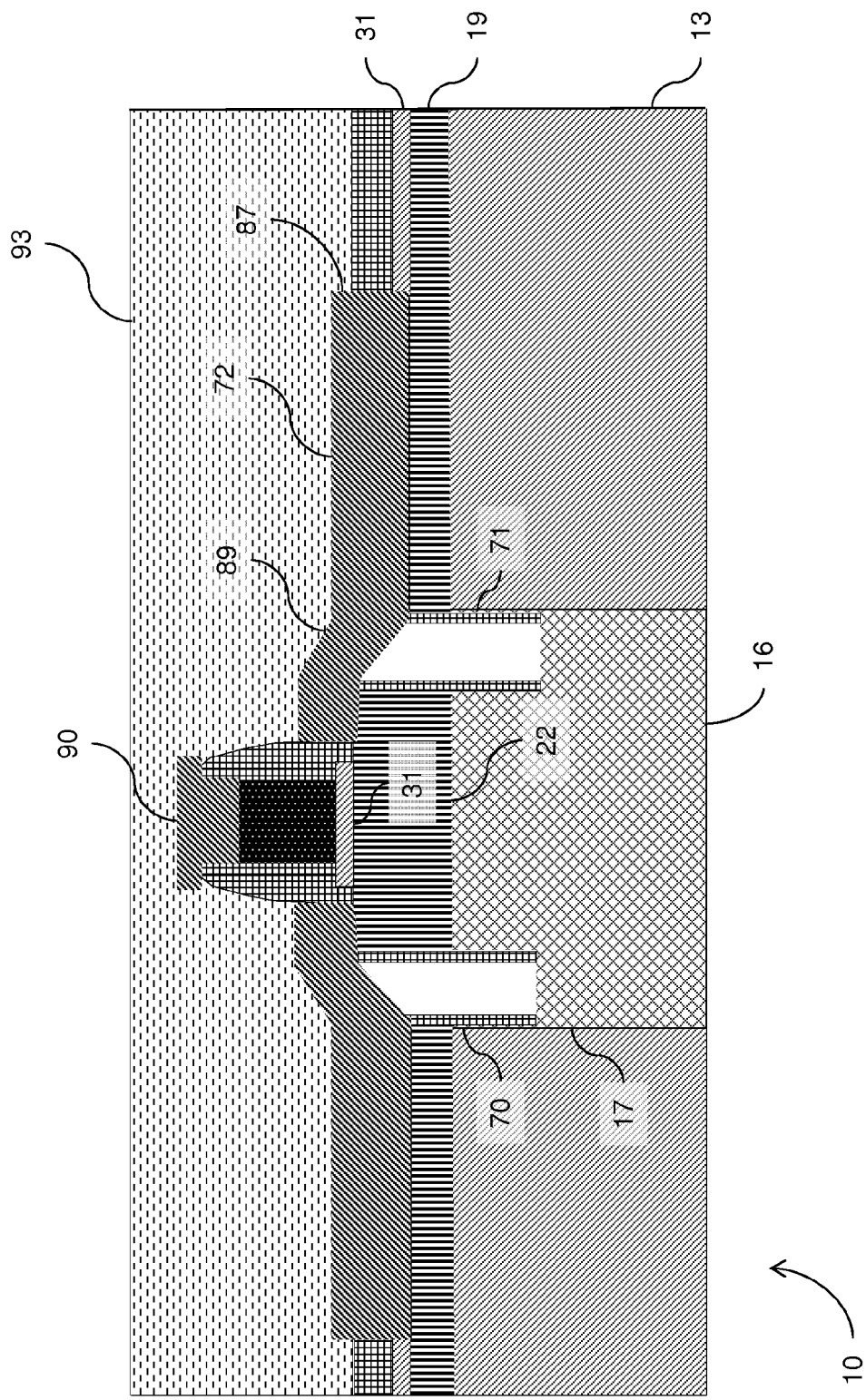

In the next steps, the base and emitter are isolated. Referring to FIG. 14, a thick layer of oxide 93, for example, approximately 5000 Å to 8000 Å thick layer of ozone-TEOS, is deposited on the Si/SiGe layer 87 and the exposed portions of the nitride pads 56, 57. In FIG. 15, the layer of oxide 93 is cleaned and polished using a CMP (chemical-mechanical polishing) process. The CMP process combines abrasion and dissolution to remove excess material from the top surface of the layer of oxide 93. The CMP process should be stopped at a certain height, e.g., approximately 1000 Å above the Si/SiGe cap 90 in the emitter stack. The details regarding low-k dielectrics used within semiconductor structures, preclean operations, CMP processing, etc. are discussed in U.S. Patent Publication 2007/0249156, which is incorporated herein by reference, and the details of such operations are not set forth herein.

Figure 16:
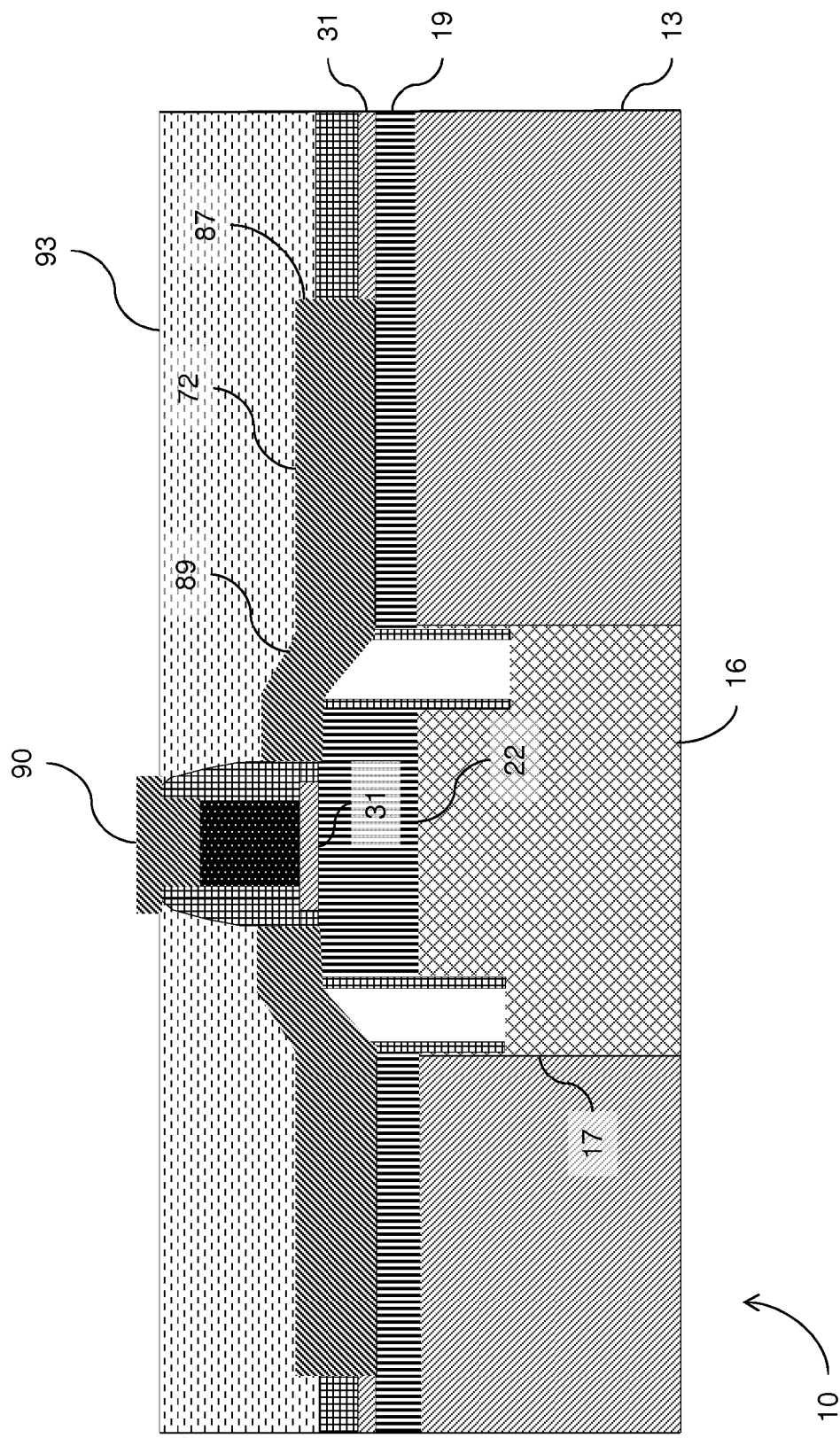

In FIG. 16, the layer of oxide 93 is reduced. For example, such an oxide reduction process can be to reactive ion etch (RIE) 1500 Å of the oxide, using an etch that is selective to nitride (with an oxide to nitride etch ratio of, for example, 20:1), and to expose the Si/SiGe cap 90 of the sacrificial-emitter pedestal.

Figure 17:
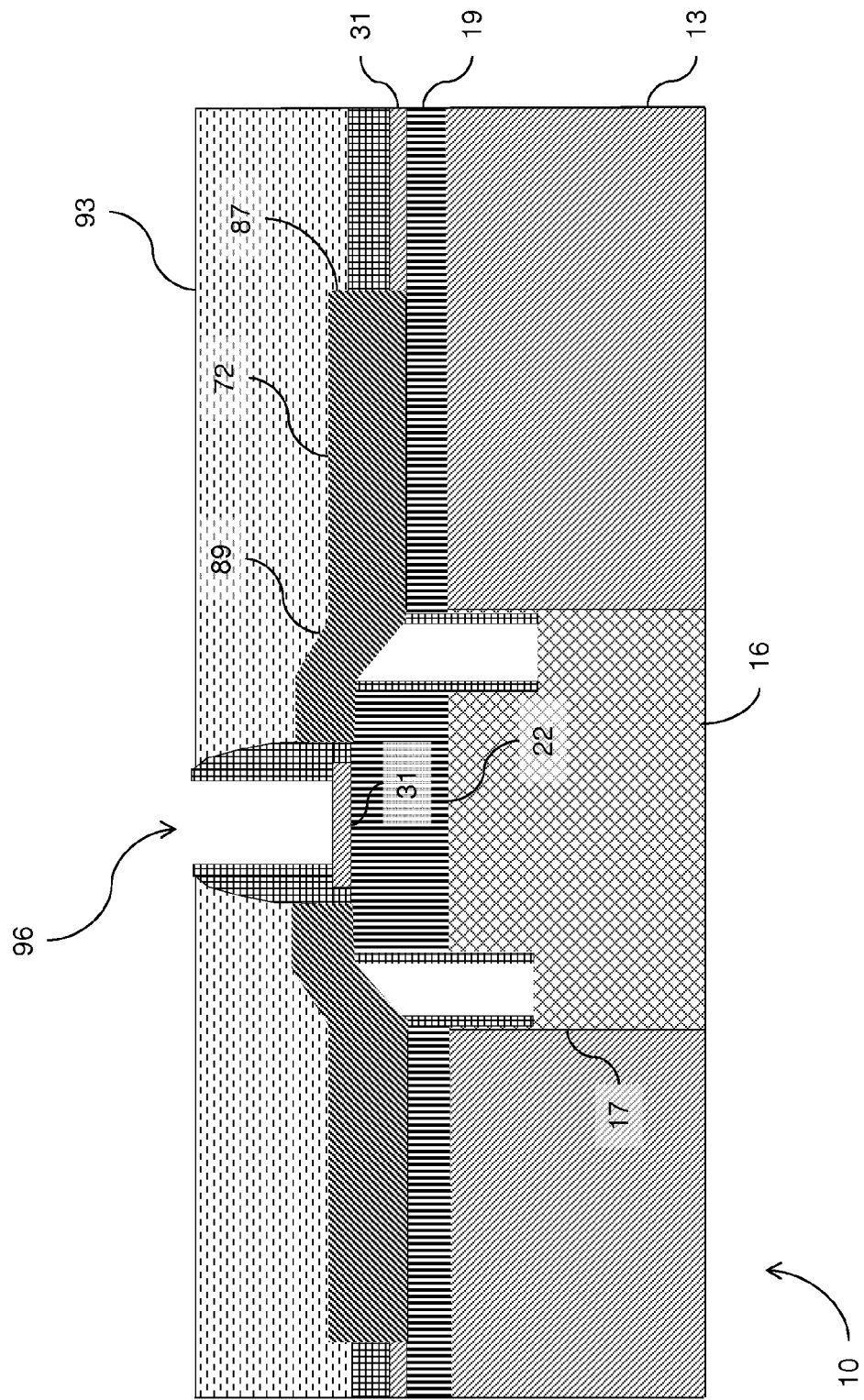
Figure 18:
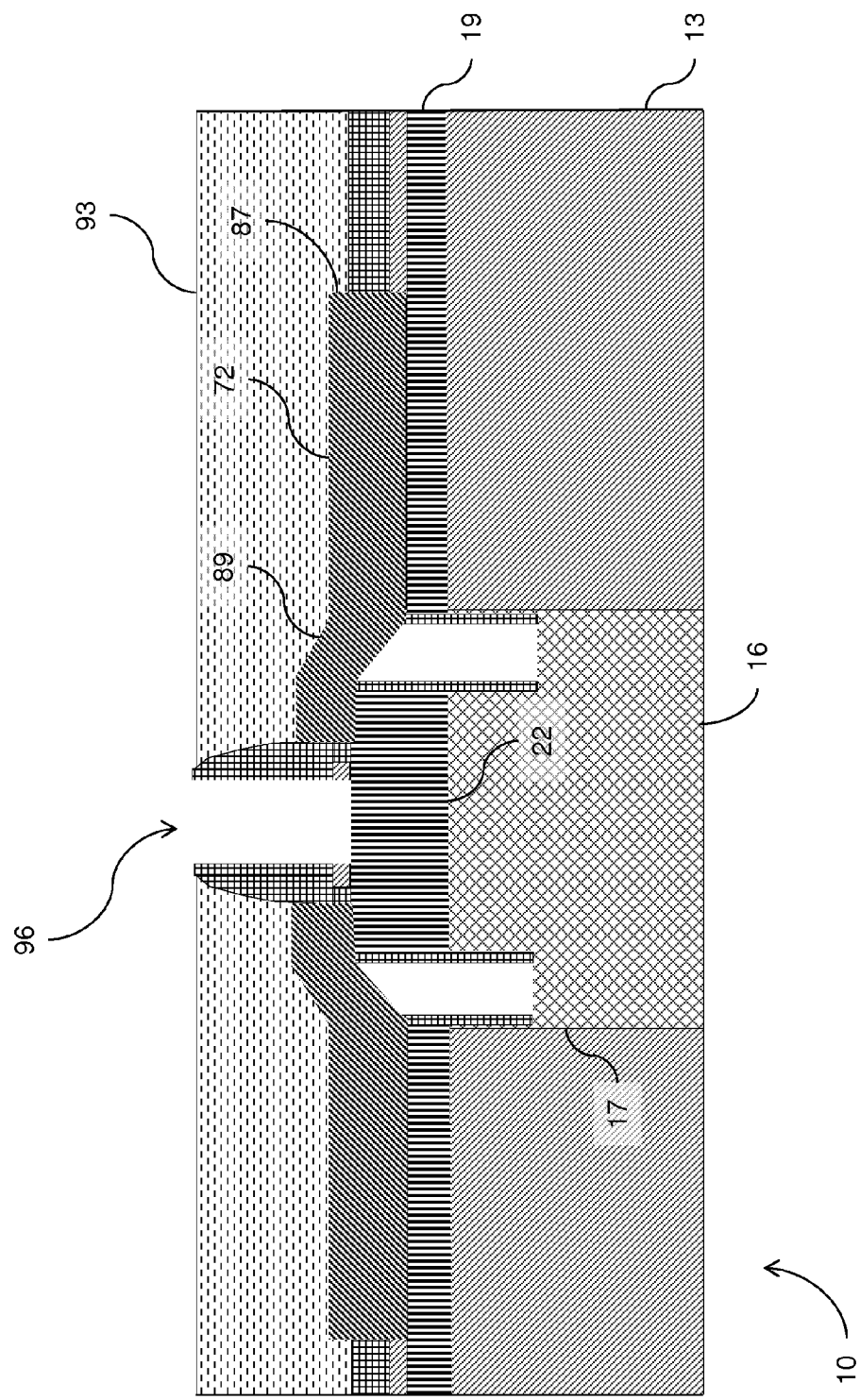

The next step is to poly etch the sacrificial emitter stack 40 to remove both the Si/SiGe cap 90 that was grown during the growth of extrinsic base film by selective epitaxy and the polysilicon portion 43 of the sacrificial emitter stack 40 in order to create an emitter window 96. As is known in the art, the poly etching process used here is highly selective to oxide and stops on the remaining segment of layer 31, as shown in FIG. 17; that is, an initial segment of the etching process removes the unprotected regions of Si/SiGe cap 90 and the polysilicon portion 43 and stops on the material of layer 31. As described above, layer 31 may comprise a dielectric. In FIG. 18, the etch chemistry may be changed to remove the unprotected regions of layer 31, which is underlying the polysilicon portion 43.

In FIG. 18, the segment of layer 31 remaining in the emitter window 96 is removed by an appropriate procedure; for example, another etching process, such as chemical oxide removal (COR) that stops on the layer of the intrinsic base 22, is used to remove the material of the segment of layer 31 exposed by the emitter window 96.

Figure 19:
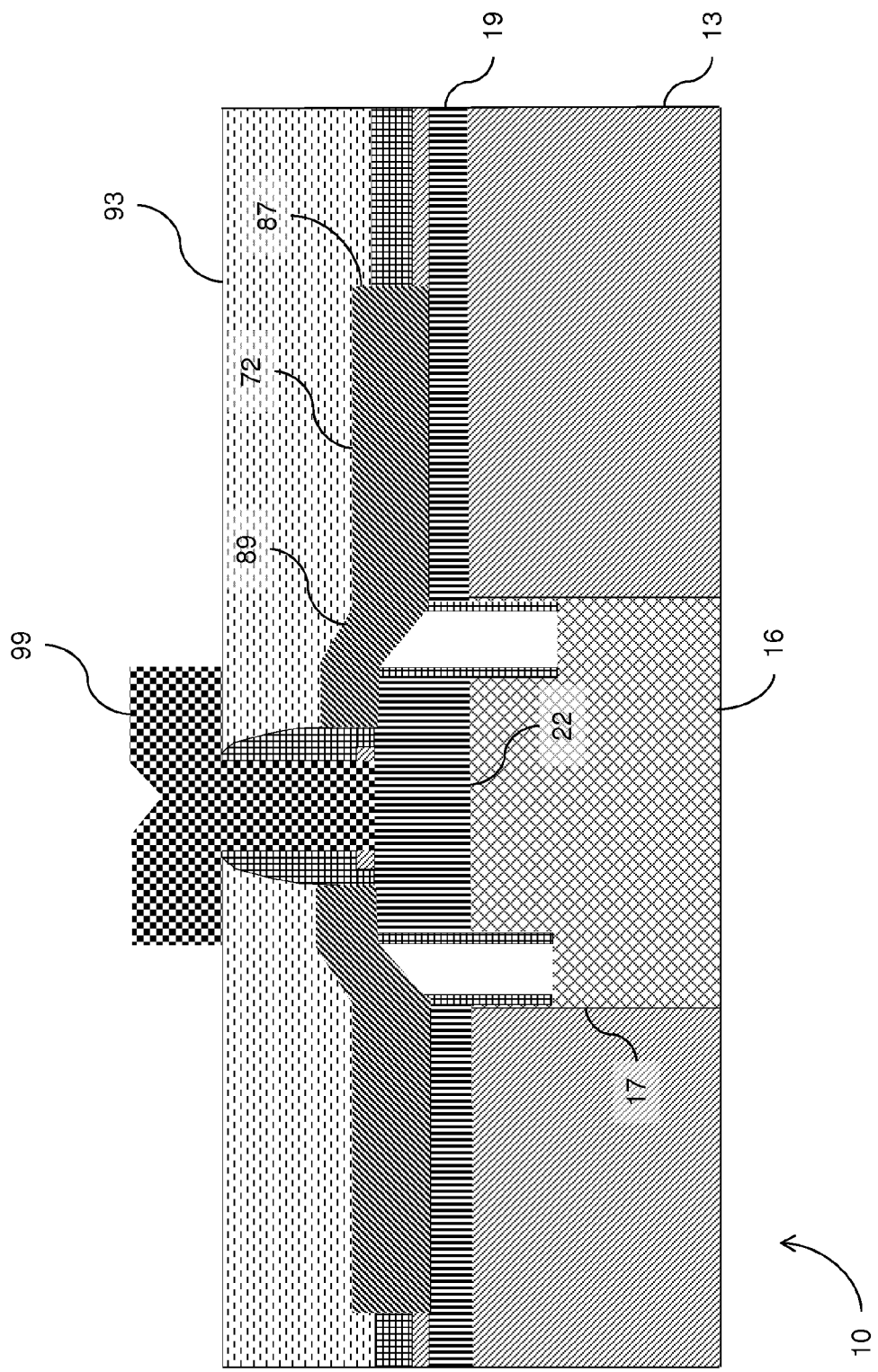

In FIG. 19, the emitter 99 is deposited in the emitter window 96. One example in the fabrication of an improved hetero-junction bipolar transistor (HBT) is to use an in-situ doped (ISD) emitter for generating the HBT without an oxide interface at the emitter-base junction. Photolithographic deposition and etching has been used to define the shape of the emitter 99

Figure 20:
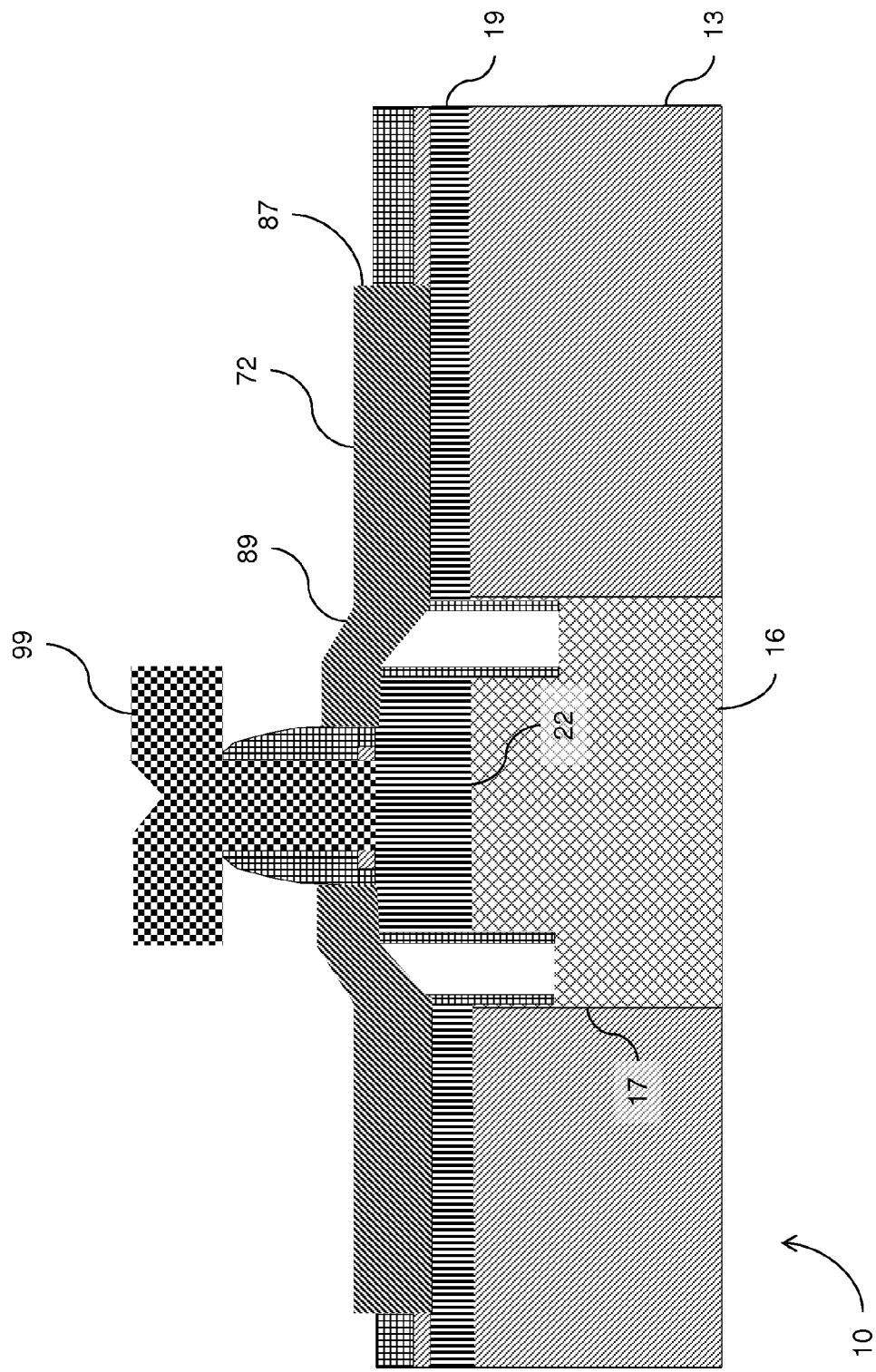

In FIG. 20, a later process step is shown where layer of oxide 93 is removed to prepare for silicide formation.

Figure 21:
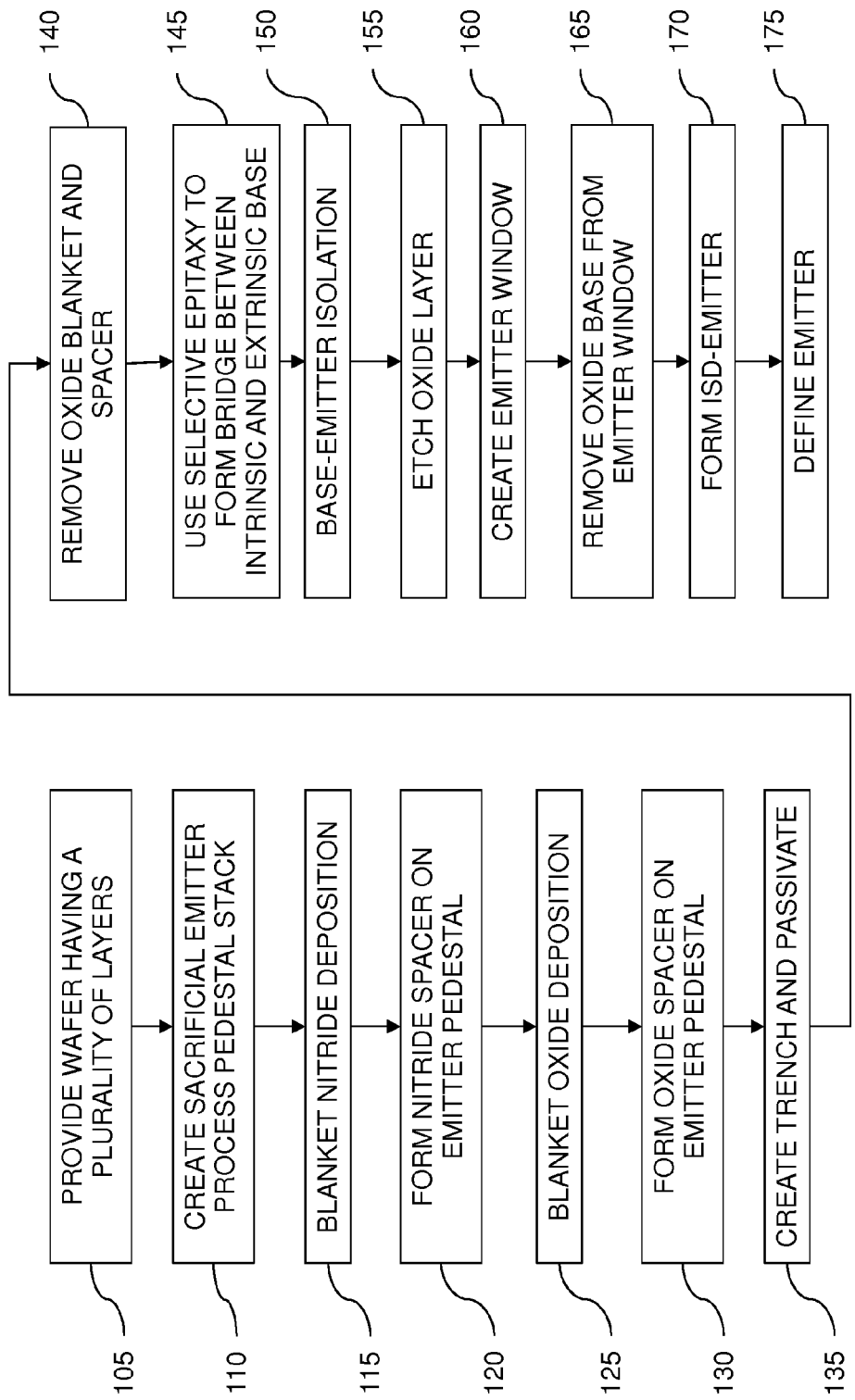
FIG. 21 is a flow diagram illustrating embodiments herein.

FIG. 21 illustrates a logic flowchart for an embodiment of a method of bridging an extrinsic and intrinsic base by selective epitaxy in BiCMOS semiconductor process technology. At 105, a self-aligned sacrificial emitter process pedestal stack is provided on a wafer substrate. At 110, a pedestal stack is created by a sacrificial emitter process. The pedestal stack includes a first polysilicon layer and a first oxide layer. Optionally, a first silicon nitride layer may be included between the first polysilicon layer and a first oxide layer. A nitride blanket is deposited, at 115, followed by a nitride etch with mask to open an extrinsic base. At 120, a nitride spacer is formed for the emitter pedestal, such that the nitride remains outside of the NPN base region. (This helps to ensure that subsequent selective epitaxial growth occurs in only the NPN base region.) At 125, an oxide blanket is deposited and subsequently etched with a mask, such that an oxide spacer is formed adjacent to the nitride spacer on the emitter pedestal, at 130. At 135, a trench is created around the emitter pedestal. Optionally, a thin layer of silicon, preferably p-doped, is deposited in the trench. A thin oxide layer may be formed using high-pressure oxidation to passivate the trench. A nitride deposition is performed to form a spacer inside the trench, such that nitride etch has enough overetch to leave no nitride film over the oxide spacer. The oxide spacer and oxide blanket are removed using a wet chemical etch, at 140. At 145, selective epitaxy of SiGe is used to form an extrinsic base at two regions on either side of the trench and the bridge connecting the regions, such that no growth originates from bottom of the trench. Sideways growth is minimized by making the height of the nitride spacer on the emitter stack taller than the polysilicon portion of the pedestal. Base-emitter isolation is provided, at 150, by depositing an oxide layer and subsequent chemical mechanical polish (CMP) of the oxide layer. At 155, the oxide layer is reduced by performing an oxide recess etch using reactive ion etch processing selective to nitride (20:1), and expose the sacrificial-emitter pedestal poly. At 160, a polysilicon etch is performed to remove both SiGe and Si to create an emitter window. The polysilicon etch is highly selective to the oxide and stops on the base oxide. At 165, the base oxide in the emitter window is removed. At 170, an emitter is formed by in-situ doped emitter deposition in the emitter window. Then, photolithographic deposition and etch (NP mask) is used to define the emitter, at 175.

In a first embodiment, a method of forming a heterojunction bipolar transistor is disclosed. The method includes providing a structure comprising at least an intrinsic base region and an emitter pedestal region. A stack comprising a polysilicon layer and a top sacrificial oxide layer is formed on the intrinsic base region. A trench is formed in the structure. The trench circumscribes the intrinsic base region and the stack. An extrinsic base is formed at two regions by a selective epitaxial growth process to create a bridge over the trench that connects the two regions. Layers of the stack are removed to provide an opening that exposes the intrinsic base region. An emitter is formed in the opening.

In a second embodiment, a method of forming a semiconductor device is disclosed. The method includes providing a self-aligned sacrificial emitter process pedestal stack on a wafer. A SiGe layer is grown on the wafer. A trench is formed in the wafer. The trench circumscribes the pedestal stack and defines an intrinsic base of a bipolar transistor. A selective epitaxial growth process is performed to form an extrinsic base at two regions around the stack and a bridge over the trench. The bridge connects the two regions. The selective epitaxial growth process ensures substantially no growth originates from a bottom of the trench. An emitter window is formed in the pedestal stack. In-situ doped emitter deposition is performed in the emitter window. Photolithographic deposition and etching is performed to define an emitter of the bipolar transistor.

With its unique and novel features, the embodiments herein teach a structure that includes an NPN device with a self-aligned emitter, base, and collector, which has a Si and/or SiGe bridge linking an extrinsic base in contact with an intrinsic base. The method utilizes selective epitaxy to build the bridge over a trench that isolates the intrinsic base from the extrinsic base.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Aspects of the present disclosure are described herein with reference to flowchart illustrations and/or block diagrams of methods, apparatus (systems), and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A representative hardware environment for practicing the embodiments herein is depicted in FIG. 22. This schematic drawing illustrates a hardware configuration of an information handling/computer system in accordance with the embodiments herein. The system comprises at least one processor or central processing unit (CPU) 210. The CPUs 210 are interconnected via system bus 212 to various devices such as a random access memory (RAM) 214, read-only memory (ROM) 216, and an input/output (I/O) adapter 218. The I/O adapter 218 can connect to peripheral devices, such as disk units 211 and tape drives 213, or other program storage devices that are readable by the system. The system can read the inventive instructions on the program storage devices and follow these instructions to execute the methodology of the embodiments herein.

In FIG. 22, CPUs 210 perform various processing based on a program stored in a Read Only Memory (ROM) 216 or a program loaded from a peripheral device, such as disk units 211 and tape drives 213 to a Random Access Memory (RAM) 214. In the RAM 214, required data when the CPU 210 performs the various processing or the like is also stored as necessary. The CPU 210, the ROM 216, and the RAM 214 are connected to one another via a bus 212. An input/output adapter 218 is also connected to the bus 212 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 214, as necessary.

The system further includes a user interface adapter 219 that connects a keyboard 215, mouse 217, speaker 224, microphone 222, and/or other user interface devices such as a touch screen device (not shown) to the bus 212 to gather user input. Additionally, a communication adapter 220 including a network interface card such as a LAN card, a modem, or the like connects the bus 212 to a data processing network 225. The communication adapter 220 performs communication processing via a network such as the Internet. A display adapter 221 connects the bus 212 to a display device 223, which may be embodied as an output device such as a monitor (such as a Cathode Ray Tube (CRT), a Liquid Crystal Display (LCD), or the like), printer, or transmitter, for example.

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
   a wafer;
   a self-aligned sacrificial emitter process pedestal stack on said wafer;
   a SiGe layer on said wafer;
   a trench in said wafer, said trench circumscribing said pedestal stack and defining an intrinsic base of a bipolar transistor;
   an extrinsic base of said bipolar transistor comprising:
      a first portion around said pedestal stack, said first portion being located between said trench and said pedestal stack;
      a second portion around said pedestal stack, said trench being between and said first portion located and said pedestal stack; and
      a bridge over said trench, said bridge connecting said first portion and said second portion;
   an emitter window in said pedestal stack; and
   an in-situ doped emitter in said emitter window.

2. The device according to claim 1, said wafer further comprising a silicon layer comprising a collector of said bipolar transistor, said collector being at a location aligned vertically with said emitter, and said collector being electrically isolated from a remainder of said wafer by shallow trench isolation.

3. The device according to claim 1, further comprising:
   a nitride spacer on said emitter pedestal.

4. The device according to claim 1, further comprising:
   a spacer formed inside said trench.

5. The device according to claim 4, said spacer comprising a nitride.

6. The device according to claim 1, said extrinsic base comprising a silicon-germanium compound.

7. The device according to claim 1, further comprising a dielectric spacer separating said emitter from said extrinsic base.

* * * * *